US011876391B2

United States Patent
Tham et al.

(10) Patent No.: US 11,876,391 B2
(45) Date of Patent: *Jan. 16, 2024

(54) CIRCUITS AND METHODS FOR WEARABLE DEVICE CHARGING AND WIRED CONTROL

(71) Applicant: Snap Inc., Santa Monica, CA (US)

(72) Inventors: Yu Jiang Tham, Los Angeles, CA (US); Nicholas Larson, Playa Vista, CA (US); Peter Brook, Marina del Rey, CA (US); Russell Douglas Patton, Marina Del Rey, CA (US); Miran Alhaideri, Los Angeles, CA (US); Zhihao Hong, Marina Del Rey, CA (US)

(73) Assignee: SNAP INC, Santa Monica, CA (US)

( * ) Notice: Subject to any disclaimer, the term of this patent is extended or adjusted under 35 U.S.C. 154(b) by 168 days.

This patent is subject to a terminal disclaimer.

(21) Appl. No.: 17/168,797

(22) Filed: Feb. 5, 2021

(65) Prior Publication Data

US 2021/0194178 A1  Jun. 24, 2021

Related U.S. Application Data

(63) Continuation of application No. 16/829,567, filed on Mar. 25, 2020, now Pat. No. 10,938,151, which is a
(Continued)

(51) Int. Cl.
*H02J 7/00* (2006.01)
*H02J 7/04* (2006.01)
(Continued)

(52) U.S. Cl.
CPC ............ *H02J 7/0034* (2013.01); *G02C 5/146* (2013.01); *G02C 11/10* (2013.01);
(Continued)

(58) Field of Classification Search
CPC ........................................................ H04B 3/56
(Continued)

(56) References Cited

U.S. PATENT DOCUMENTS

| 4,139,880 A | 2/1979 | Ulmer et al. |
| 4,734,919 A | 3/1988 | Tae |

(Continued)

FOREIGN PATENT DOCUMENTS

| CA | 2887596 | 7/2015 |
| CN | 104536318 | 4/2015 |

(Continued)

OTHER PUBLICATIONS

"Taiwanese Application Serial No. 110129023, First Office Action dated May 19, 2022", w/ English Machine Translation, 24 pgs.
(Continued)

*Primary Examiner* — Edward Tso
*Assistant Examiner* — Ahmed H Omar
(74) *Attorney, Agent, or Firm* — SCHWEGMAN LUNDBERG & WOESSNER, P.A.

(57) ABSTRACT

Methods and devices for wired charging and communication with a wearable device are described. In one embodiment, a symmetrical contact interface comprises a first contact pad and a second contact pad, and particular wired circuitry is coupled to the first and second contact pads to enable charging as well as receive and transmit communications via the contact pads as part of various device states.

20 Claims, 21 Drawing Sheets

Related U.S. Application Data continuation of application No. 16/250,984, filed on Jan. 17, 2019, now Pat. No. 10,637,183, which is a continuation of application No. 15/782,575, filed on Oct. 12, 2017, now Pat. No. 10,218,114.

(60) Provisional application No. 62/407,374, filed on Oct. 12, 2016.

(51) Int. Cl.
| | |
|---|---|
| *H04B 3/56* | (2006.01) |
| *G02C 5/14* | (2006.01) |
| *G02C 11/00* | (2006.01) |
| *H01L 27/02* | (2006.01) |
| *H01R 13/62* | (2006.01) |
| *H03K 19/0185* | (2006.01) |
| *H02J 7/34* | (2006.01) |
| *H04B 3/54* | (2006.01) |
| *G02C 1/00* | (2006.01) |

(52) U.S. Cl.
CPC ..... *H01L 27/0266* (2013.01); *H01R 13/6205* (2013.01); *H02J 7/0045* (2013.01); *H02J 7/0068* (2013.01); *H02J 7/04* (2013.01); *H02J 7/345* (2013.01); *H03K 19/018557* (2013.01); *H04B 3/56* (2013.01); *G02C 1/00* (2013.01); *H02J 7/00* (2013.01); *H02J 7/00034* (2020.01); *H02J 7/00302* (2020.01); *H02J 7/00306* (2020.01); *H04B 3/548* (2013.01); *H04B 2203/547* (2013.01); *H04B 2203/5454* (2013.01)

(58) Field of Classification Search
USPC .......................................................... 320/114
See application file for complete search history.

(56) References Cited

U.S. PATENT DOCUMENTS

| | | | |
|---|---|---|---|
| 5,623,550 A | 4/1997 | Killion | |
| 5,900,720 A * | 5/1999 | Kallman | G02F 1/163 |
| | | | 351/44 |
| 5,986,539 A | 11/1999 | Johansson et al. | |
| 6,038,295 A | 3/2000 | Mattes | |
| 6,980,909 B2 | 12/2005 | Root et al. | |
| 7,173,651 B1 | 2/2007 | Knowles | |
| 7,411,493 B2 | 8/2008 | Smith | |
| 7,535,890 B2 | 5/2009 | Rojas | |
| 8,131,597 B2 | 3/2012 | Hudetz | |
| 8,199,747 B2 | 6/2012 | Rojas et al. | |
| 8,332,475 B2 | 12/2012 | Rosen et al. | |
| 8,718,333 B2 | 5/2014 | Wolf et al. | |
| 8,724,622 B2 | 5/2014 | Rojas | |
| 8,874,677 B2 | 10/2014 | Rosen et al. | |
| 8,909,679 B2 | 12/2014 | Root et al. | |
| 8,995,433 B2 | 3/2015 | Rojas | |
| 9,040,574 B2 | 5/2015 | Wang et al. | |
| 9,055,416 B2 | 6/2015 | Rosen et al. | |
| 9,100,806 B2 | 8/2015 | Rosen et al. | |
| 9,100,807 B2 | 8/2015 | Rosen et al. | |
| 9,191,776 B2 | 11/2015 | Root et al. | |
| 9,204,252 B2 | 12/2015 | Root | |
| 9,380,374 B2 | 6/2016 | Sprague et al. | |
| 9,413,181 B2 | 8/2016 | Ford | |
| 9,443,227 B2 | 9/2016 | Evans et al. | |
| 9,489,661 B2 | 11/2016 | Evans et al. | |
| 9,491,134 B2 | 11/2016 | Rosen et al. | |
| 10,218,114 B2 | 2/2019 | Tham et al. | |
| 10,547,187 B2 | 1/2020 | Yoon et al. | |
| 10,637,183 B2 | 4/2020 | Tham et al. | |
| 10,686,279 B2 | 6/2020 | Patton et al. | |
| 10,938,151 B2 | 3/2021 | Tham et al. | |
| 11,081,836 B2 | 8/2021 | Patton et al. | |
| 2004/0012045 A1 | 1/2004 | Lee | |
| 2004/0080298 A1 | 4/2004 | Maggert et al. | |
| 2004/0121223 A1 | 6/2004 | Kim | |
| 2005/0112951 A1 | 5/2005 | Chen et al. | |
| 2005/0221654 A1 | 10/2005 | Phillips et al. | |
| 2005/0242771 A1* | 11/2005 | Blum | G02C 7/101 |
| | | | 320/114 |
| 2007/0146564 A1 | 6/2007 | Wu et al. | |
| 2007/0188135 A1 | 8/2007 | Odaohhara | |
| 2008/0180060 A1 | 7/2008 | Odell et al. | |
| 2009/0003481 A1 | 1/2009 | Schopfer et al. | |
| 2009/0130874 A1 | 5/2009 | Englund | |
| 2010/0093394 A1* | 4/2010 | Hidaka | H04M 1/72412 |
| | | | 455/557 |
| 2010/0112949 A1 | 5/2010 | Kim et al. | |
| 2011/0202598 A1 | 8/2011 | Evans et al. | |
| 2011/0260686 A1 | 10/2011 | Ford | |
| 2012/0106042 A1 | 5/2012 | Ashida et al. | |
| 2012/0209924 A1 | 8/2012 | Evans et al. | |
| 2014/0184771 A1 | 7/2014 | Mazzetti et al. | |
| 2014/0346890 A1 | 11/2014 | Haseno et al. | |
| 2016/0119464 A1 | 4/2016 | Kim et al. | |
| 2017/0010659 A1* | 1/2017 | Park | G06F 1/26 |
| 2017/0019151 A1* | 1/2017 | Kahn | H04B 3/548 |
| 2017/0256968 A1 | 9/2017 | Yoon et al. | |
| 2018/0102605 A1 | 4/2018 | Patton et al. | |
| 2018/0102606 A1 | 4/2018 | Tham et al. | |
| 2018/0131231 A1 | 5/2018 | Nakano et al. | |
| 2019/0113774 A1 | 4/2019 | Anderson et al. | |
| 2019/0260158 A1 | 8/2019 | Tham et al. | |
| 2020/0287324 A1 | 9/2020 | Tham et al. | |
| 2020/0350728 A1 | 11/2020 | Patton et al. | |
| 2021/0344140 A1 | 11/2021 | Patton et al. | |

FOREIGN PATENT DOCUMENTS

| | | |
|---|---|---|
| CN | 204498312 | 7/2015 |
| CN | 105319718 | 2/2016 |
| CN | 105700197 | 6/2016 |
| CN | 105988232 | 10/2016 |
| EP | 0082791 | 6/1983 |
| EP | 2993756 | 3/2016 |
| EP | 3526876 | 8/2021 |
| FR | 2456349 | 12/1980 |
| JP | 2001102974 | 4/2001 |
| RU | 2263384 | 10/2005 |
| TW | M500927 | 5/2015 |
| TW | M520647 | 4/2016 |
| TW | 201626121 | 7/2016 |
| TW | 201825969 | 7/2018 |
| TW | 201830820 | 8/2018 |
| TW | 202134742 | 6/2021 |
| TW | I731179 | 6/2021 |
| TW | I738890 | 9/2021 |
| TW | 202209780 | 3/2022 |
| WO | 2018071686 | 4/2018 |
| WO | 2018071694 | 4/2018 |

OTHER PUBLICATIONS

"Taiwanese Application Serial No. 110117808, Office Action dated Jun. 6, 2022", w/ English Machine Translation, 11 pgs.

"Taiwan Application Serial No. 110129023, Response filed Aug. 19, 2022 to Office Action dated May 19, 2022", w/ English Translation, 31 pgs.

"Taiwanese Application Serial No. 110117808, Response filed Sep. 5, 2022 to Office Action dated Jun. 6, 2022", w/ English Translation, 51 pgs.

"International Application Serial No. PCT/US2017/056364, International Search Report dated Jan. 5, 2018", 4 pgs.

"International Application Serial No. PCT/US2017/056364, Written Opinion dated Jan. 5, 2018", 8 pgs.

"International Application Serial No. PCT/US2017/056375, International Search Report dated Feb. 7, 2018", 2 pgs.

"International Application Serial No. PCT/US2017/056375, Written Opinion dated Feb. 7, 2018", 4 pgs.

(56) References Cited

OTHER PUBLICATIONS

"U.S. Appl. No. 15/782,575, Notice of Allowance dated Oct. 11, 2018", 10 pgs.

"International Application Serial No. PCT/US2017/056364, International Preliminary Report on Patentability dated Apr. 25, 2019", 8 pgs.

"International Application Serial No. PCT/US2017/056375, International Preliminary Report on Patentability dated Apr. 25, 2019", 6 pgs.

"U.S. Appl. No. 16/250,984, Non Final Office Action dated May 31, 2019", 6 pgs.

"U.S. Appl. No. 16/250,984, Response filed Sep. 3, 2019 to Non-Final Office Action dated May 31, 2019", 8 pgs.

"European Application Serial No. 17859683.9, Extended European Search Report dated Oct. 28, 2019", 8 pgs.

"European Application Serial No. 17794820.5, Response filed Nov. 25, 2019 to Communication pursuant to Rules 161(1) and 162 EPC filed May 21, 2019", 20 pgs.

"U.S. Appl. No. 16/250,984, Notice of Allowance dated Dec. 18, 2019", 8 pgs.

"U.S. Appl. No. 15/782,562, Notice of Allowance dated Feb. 10, 2020", 9 pgs.

"U.S. Appl. No. 16/250,984, Supplemental Notice of Allowability dated Feb. 21, 2020", 2 pgs.

"Taiwanese Application Serial No. 106134910, Office Action dated May 5, 2020", w/ English translation, 13 pgs.

"U.S. Appl. No. 16/829,567, Preliminary Amendment filed May 29, 2020", 6 pgs.

"U.S. Appl. No. 16/829,567, Non Final Office Action dated Jul. 9, 2020", 8 pgs.

"Taiwanese Application Serial No. 106134910, Response filed Aug. 4, 2020 to Office Action dated May 5, 2020", w/ English Claims, 52 pgs.

"European Application Serial No. 17794820.5, Communication Pursuant to Article 94(3) EPC dated Aug. 4, 2020", 4 pgs.

"U.S. Appl. No. 16/875,485, Preliminary Amendment, filed Aug. 31, 2020", 8 pgs.

"Taiwanese Application Serial No. 106134913, Office Action dated Sep. 21, 020", w/ English translation, 6 pgs.

"U.S. Appl. No. 16/829,567, Response filed Oct. 8, 2020 to Non Final Office Action dated Jul. 9, 2020", 8 pgs.

"Taiwanese Application Serial No. 106134910, Office Action dated Sep. 24, 2020", w/ English translation, 4 pgs.

"U.S. Appl. No. 16/829,567, Notice of Allowance dated Oct. 29, 2020", 8 pgs.

"Taiwanese Application Serial No. 106134913, Response Filed Dec. 2, 2020 to Office Action dated Sep. 21, 2020", w/ English Claims, 55 pgs.

"Taiwanese Application Serial No. 106134910, Response filed Nov. 26, 2020 to Office Action dated Sep. 24, 2020", w/ English Claims, 52 pgs.

"European Application Serial No. 17794820.5, Response filed Dec. 4, 2020 to Communication Pursuant to Article 94(3) EPC dated Aug. 4, 2020", w/ English Claims, 11 pgs.

"U.S. Appl. No. 16/875,485, Non Final Office Action dated Jan. 26, 2021", 5 pgs.

"U.S. Appl. No. 16/875,485, Response filed Mar. 2, 2021 to Non Final Office Action dated Jan. 26, 2021", 7 pgs.

"U.S. Appl. No. 16/875,485, Notice of Allowance dated Apr. 2, 2021", 5 pgs.

Leyden, John, "This SMS will self-destruct in 40 seconds", [Online] Retrieved from the Internet: <URL: http://www.theregister.co.uk/2005/12/12/stealthtext/>, (Dec. 12, 2005), 1 pg.

U.S. Appl. No. 17/376,507, filed Jul. 15, 2021, Circuits and Methods for Wearable Device Charging and Wired Control.

"European Application Serial No. 21190137.6, Extended European Search Report dated Sep. 10, 2021", 8 pgs.

"European Application Serial No. 17859683.9, Communication Pursuant to Article 94(3) EPC dated Nov. 11, 2021", 5 pgs.

"European Application Serial No. 17859683.9, Response Filed Mar. 21, 2022 to Communication Pursuant to Article 94(3) EPC dated Nov. 11, 2021", 6 pgs.

* cited by examiner

CIRCUITS AND METHODS FOR WEARABLE DEVICE CHARGING AND WIRED CONTROL

PRIORITY CLAIMS

This application is a continuation of and claims the benefit of priority to U.S. patent application Ser. No. 16/829,567, filed on Mar. 25, 2020, which is a continuation of and claims the benefit of priority to U.S. patent application Ser. No. 16/250,984, filed on Jan. 17, 2019, which is a continuation of and claims the benefit of priority to U.S. patent application Ser. No. 15/782,575, filed on Oct. 12, 2017, which claims the benefit of priority to U.S. Provisional Patent Application Ser. No. 62/407,374, filed on Oct. 12, 2016, the benefit of priority of each of which is claimed hereby, and each of which is incorporated by reference herein in their entireties.

TECHNICAL FIELD

Embodiments of the present disclosure relate generally to mobile computing technology and, more particularly, but not by way of limitation, to systems for generating and presenting a graphical user interface that includes an animated icon at a client device.

BACKGROUND

Wearable devices such as glasses and watches have limited space for circuitry and power, and in many systems operate using wireless communications with wired charging. Limits in space and power resources require charge and control systems different from those used in other environments.

BRIEF DESCRIPTION OF THE SEVERAL VIEWS OF THE DRAWINGS

Various ones of the appended drawings merely illustrate example embodiments of the present disclosure and should not be considered as limiting its scope.

DETAILED DESCRIPTION

Embodiments described herein relate to charging and wired control of devices, particularly wearable or other compact devices with limited space. While particular embodiments are described, it will be apparent that other embodiments are possible within the scope of the described innovations.

In one embodiment, a wearable device includes a symmetrical interface with a first and second contact pad. The symmetry of the interface allows a corresponding head of a charge cable to connect to the symmetrical interface in either a first or a second direction due to the matching symmetries, which limits damage to the connector due to attempts to match the cable and the interface in an improper alignment.

Circuitry coupled to the contact pads manages both charging and receive and transmit communications for any allowed alignment. In some embodiments, field effect transistors coupled to the charge pads are configured to direct signals based on the input alignment.

Additionally, in some embodiments, a wearable device cycles through device states, with a periodic charge state and a check for data or a related signal following a charging period. As described herein, references to "charge" and "charging" are intended to refer to similar operations, and are not intended to distinguish elements (e.g. charge state and charging state). If the signal is present at the end of the charge period, the communications across the symmetrical interface cycle through receive and transmit states until returning to the charge state. At the end of the next charge period, another check is made for a signal to repeat the cycle through the transmit and receive states. If no signal for data is present, the charge period is repeated while the charge cable is attached until the cable is removed or a signal to cycle through the data states is received at the end of the periodic charge state.

The above embodiments provide a simple mechanical interface that can be disposed within wearable glasses at a hinge between a frame and an arm of the glasses, such that the interface is exposed when the arm is closed (e.g., in a position for storage) and covered when the arm is open (e.g., in a position for wearing). These embodiments enable simple charging and control with limited circuitry and a damage-resistant symmetrical interface.

Figure 1:
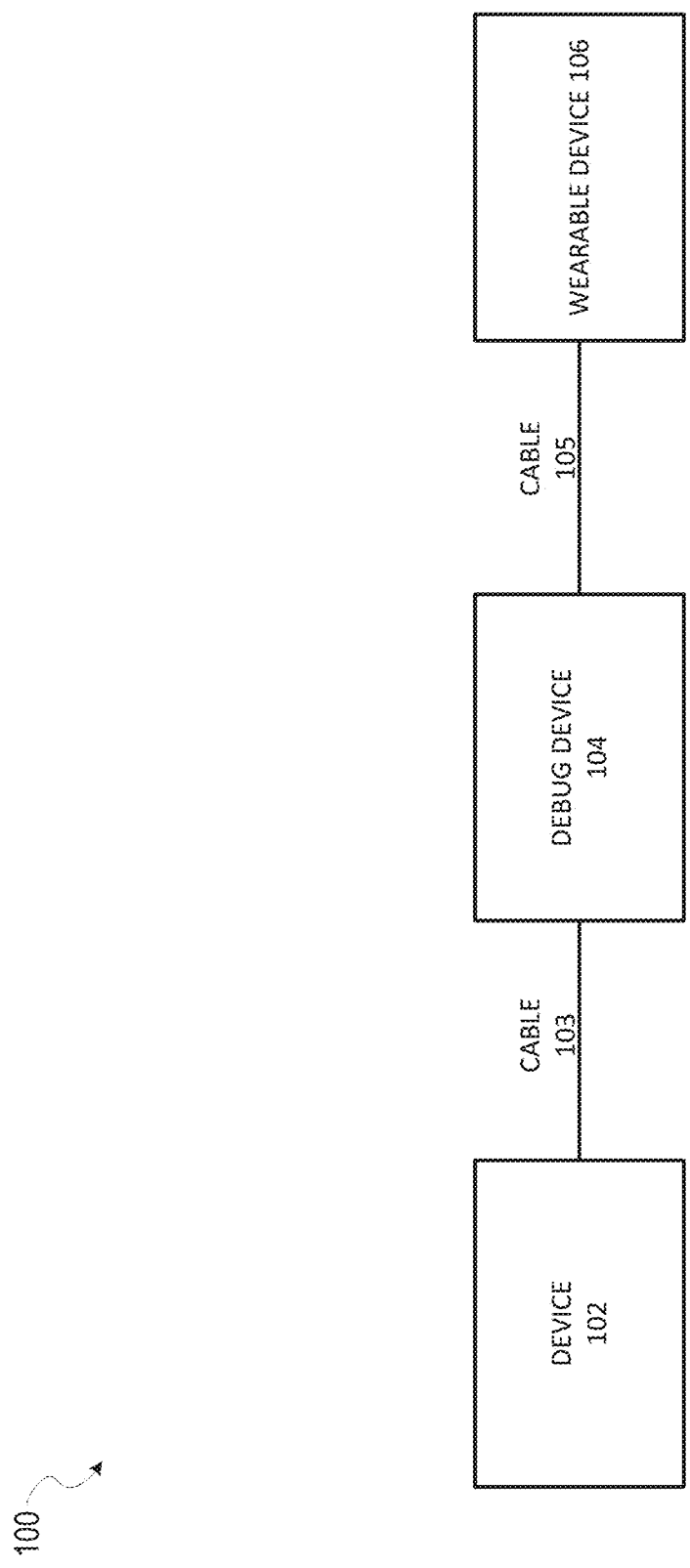
FIG. 1 illustrates aspects of a system for wearable device debug and charging, in accordance with some example embodiments.

FIG. 1 illustrates aspects of a system for wearable device debug and charging, in accordance with some example embodiments. Given the complex variety of form factors for wearable devices, and an emphasis on wireless communications to transmit data such as images, audio, or display data to a wearable device, wired options for charging and debug communications may be limited. In particular, standard cable connections such as universal serial bus (USB) form factors may involve excessive complexity for certain devices. FIG. 1 illustrates a simple debugging system 100 for wired charging and communications with a wearable device 106. The debugging system 100 includes a device 102, which may be a standard computing device running debugging software associated with various systems of the wearable device 106, and a debug device 104.

The debug device 104 may comprise specialized hardware for charging and wired communication using a two-line communication path via a cable 105 to the wearable device 106 and a cable 103 to the device 102. The cable 103, for example, may be a standard cable with USB form factor connections on both ends, while the cable 105 is a custom cable with a head on the end for connecting with the wearable device 106 as described in more detail below. In some embodiments, the device 102 and the debug device 104 may be integrated as a single device or test station system to enable debug circuitry and software to communicate with the wearable device 106 via the cable 105. References herein to a debug or debugging device thus refer to systems including any aspect of the devices 102 and 104. In one embodiment, the debug device 104 includes relays that switch between circuitry for charging and circuitry for communication, based on the system state. The relay settings and associated states may be cycled based on periodic system timing, presence of data to be transmitted, or combinations of various factors. In a charging state, the debug device 104 may include sensing circuitry and protection associated with charging the wearable device 106, to verify that the wearable device 106 charges correctly and will not be damaged by the power provided by the debug device 104. In the communication state(s), the debug device 104 may buffer data to be communicated between the device 102 and the wearable device 106. Additional details related to communication and charging operations and device states are described below.

Figure 2:
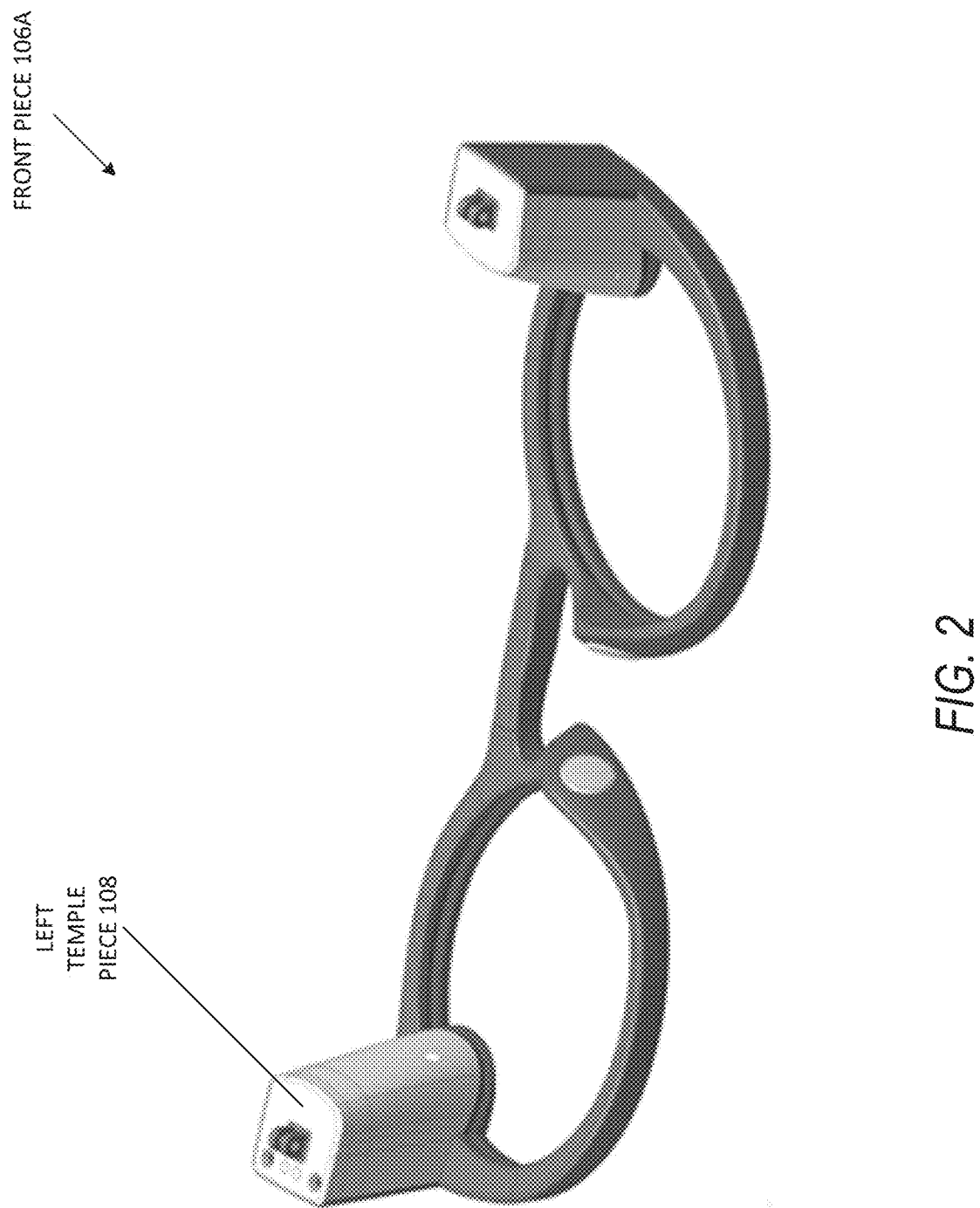
FIG. 2 illustrates aspects of a wearable device and an associated charge and wired control cable interface, in accordance with some example embodiments.

FIGS. 2-5 illustrate aspects of a wearable device and an associated charge and wired control cable interface, in accordance with some example embodiments. While FIGS. 2-5 illustrate the wearable device 106 and cable 105 as particular glasses and wired connections, it will be apparent that other form factors of a cable and wearable device are possible within the scope of the considered embodiments. FIG. 2 particularly illustrates a front piece 106A of a glasses implementation of the wearable device 106, according to embodiments described herein. The front piece 106A of FIG. 1 may be similar to a front piece 33 of glasses 31 described below. The front piece 106A includes left and right temple pieces (with a left temple piece 108 particularly shown in FIG. 1) with hinges for connecting left and right arms to the corresponding temple pieces. Next to the left hinge on the left temple piece 108 is an electrical charging interface with a magnetic fastening interface.

Figure 3:
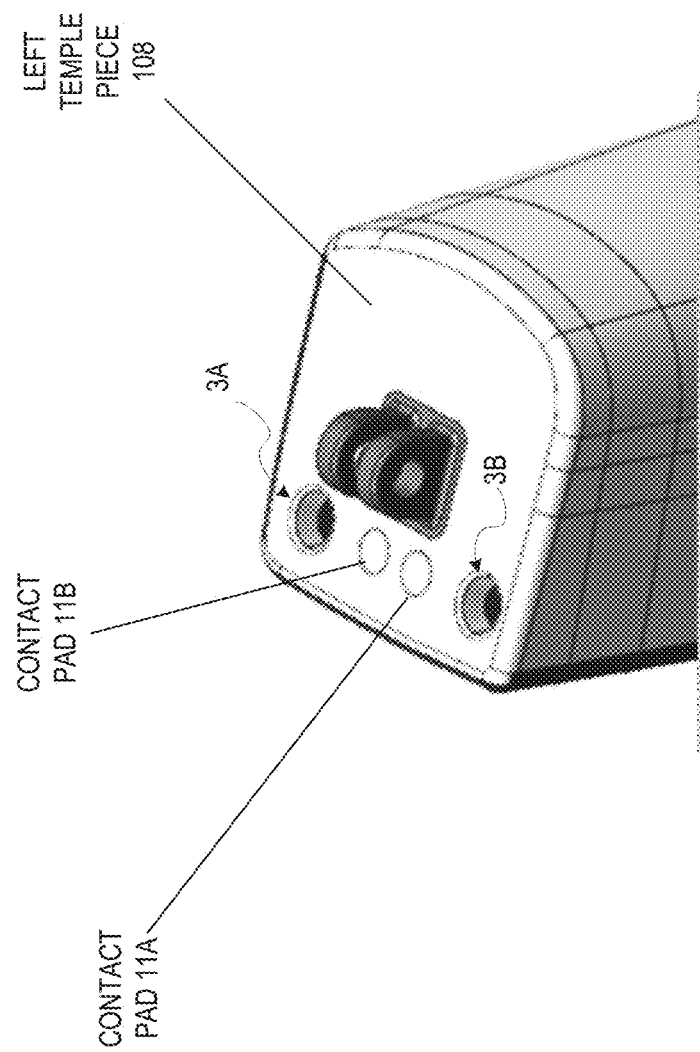
FIG. 3 illustrates aspects of a wearable device and an associated charge and wired control cable interface, in accordance with some example embodiments.

FIG. 3 provides a closer view of the hinge surface of the left temple piece 108 with the electrical charging and communication interface. The electrical charging interface includes two conductive path contacts, shown as contact pad 11A and contact pad 11B. The contacts are configured to accept pins from a reversible connector of a cable 105, detailed below with reference to FIGS. 4A, 4B, 5, and 6. Additionally, the interface includes magnetic fastening contacts 3A and 3B. The magnetic fastening contacts 3A and 3B include magnets configured to couple with two corresponding magnets on a reversible connector head of the cable 105. In other embodiments, other configurations of coupling elements to maintain the contact between the glasses and the connector may be used. For example, in one embodiment, one or the other of the aligned magnets may be replaced with a ferromagnetic material. In other embodiments, other materials such as latch fasteners or friction-based connectors may be used.

Figure 4B:
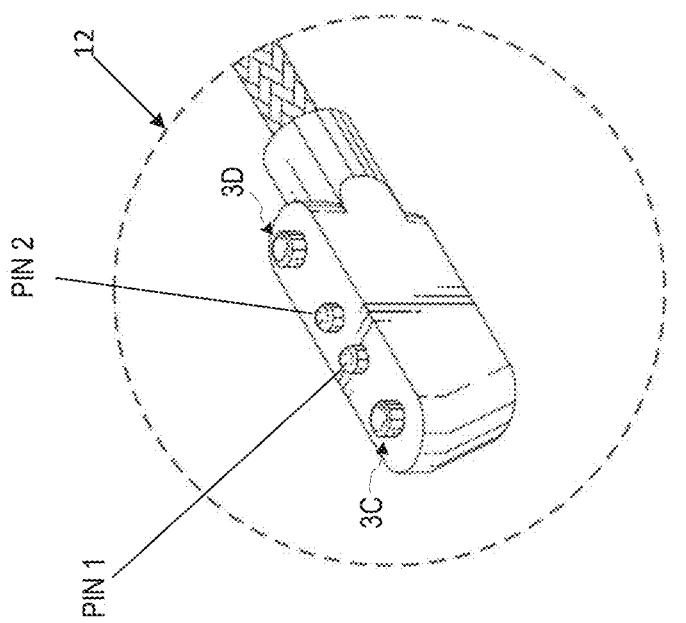
FIG. 4B illustrates aspects of a charge and wired control cable, in accordance with some example embodiments.
Figure 4A:
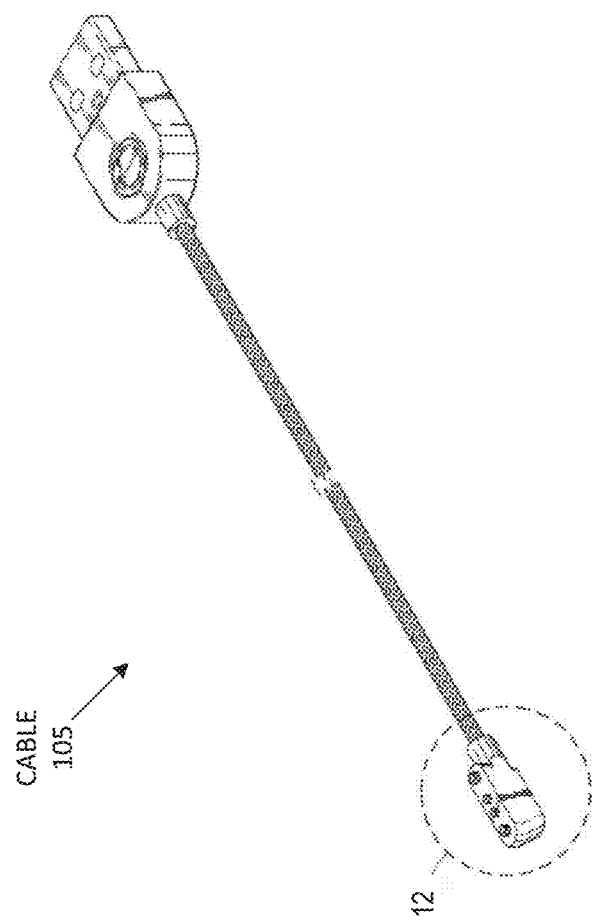
FIG. 4A illustrates aspects of a charge and wired control cable, in accordance with some example embodiments.

FIG. 4A illustrates an example cable 105, and FIG. 4B illustrates an example connector 12 of the cable 105 configured to couple with the electrical charging interface of FIGS. 2 and 3. The connector 12 includes two electrical contact pins, shown as pin 1 and pin 2, to connect to the two conductive path contacts (e.g., contact pads 11A, 11B) on the temple of the glasses front piece 106A. In some embodiments, the electrical contact pins 1 and 2 are "pogo" pins which are spring loaded. An internal spring within the connector 12 pushes each pin to a maximum position. Additionally, the example cable 105 includes magnetic contacts 3C and 3D. When the connector 12 of the cable 105 and the charging interface of the glasses are positioned together with the magnets of the cable 105 and the wearable device interface on each side aligned, the magnets pull the connector 12 and the charging interface together, with the pins 1 and 2 and the conductive path contacts (e.g., contact pads 11A, 11B) aligned. The magnets of the magnetic contacts 3D and 3C with the magnets of the magnetic contacts 3A and 3B provide force to keep the connector 12 and the charging interface coupled, while the springs in the pins 1 and 2 push the pins 1 and 2 into the conductive path contacts (e.g., contact pads 11A, 11B), displacing the pins 1 and 2 from the maximum position. The force of the magnets is sufficient to maintain the coupling in opposition to the force of the springs pushing the pins into the conductive path contacts. In various embodiments, the magnets, pins, and conductive path contacts are symmetrical, such that the pins, conductive path contacts, and magnets align when the connector 12 and charging interface are rotated 180 degrees with respect to each other. The head of the cable 105 may thus attach to the symmetrical contact interface of the wearable device in two configurations. This allows a connection when pin 1 is in contact with contact pad 11A and pin 2 is in contact with contact pad 11B, as well as when pin 1 is in contact with contact pad 11B and pin 2 is in contact with contact pad 11A.

Figure 5:
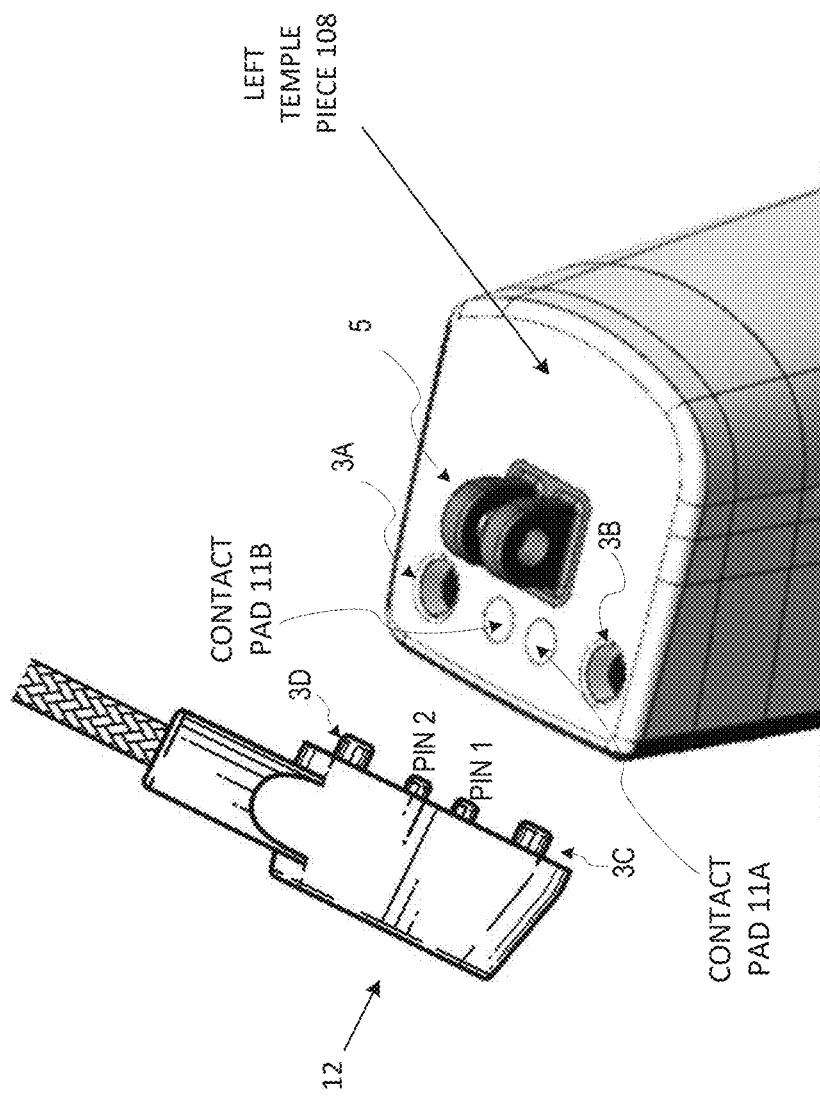
FIG. 5 illustrates aspects of a wearable device and an associated charge and wired control cable, in accordance with some example embodiments.

FIG. 5 illustrates the connector 12 and a symmetrical contact area of the left temple piece 108, with the coupling surfaces showing the matches between the magnetic contacts 3A and 3D, and between the magnetic contacts 3B and 3C. When the left arm (not shown) attached to a hinge 5 is closed, contact pads 11A and 11B are exposed, and the connector 12 can attach to the left temple piece 108 as described above, with pin 1 and pin 2 matched to exposed contact pads 11A and 11B, and magnetic contacts 3A-D maintaining the connection, regardless of the direction of the attachment. Connection circuitry described below enables the same charge and communication operations regardless of whether pin 1 is in contact with contact pad 11A and pin 2 is in contact with contact pad 11B, or pin 1 is in contact with contact pad 11B and pin 2 is in contact with contact pad 11A. The symmetry may be seen in that the connector 12 will couple with the charging contact if the cable end of the connector 12 is rotated from the bottom of the image to the top of the image. In order to place the left arm of the wearable device in an open position (e.g., in a position to be worn by a user), the connector 12 must be removed, and the interface including contact pads 11A and 1B is covered by one end of the glasses arm as it rotates around the hinge 5 to the open position. Thus, in some embodiments, the charging contacts (e.g., contact pads 11A, 11B) are placed such that the charging contact is exposed when the arms of the glasses are in a closed position. When the arms are open (e.g., positioned for wearing), an end of the corresponding arm covers the charging contact and prevents damage or exposure. In such embodiments, the connector 12 of the cable 105 is able to connect with the charging interface only when the arms are in a closed position or detached from the glasses front piece 106A.

Figure 6:
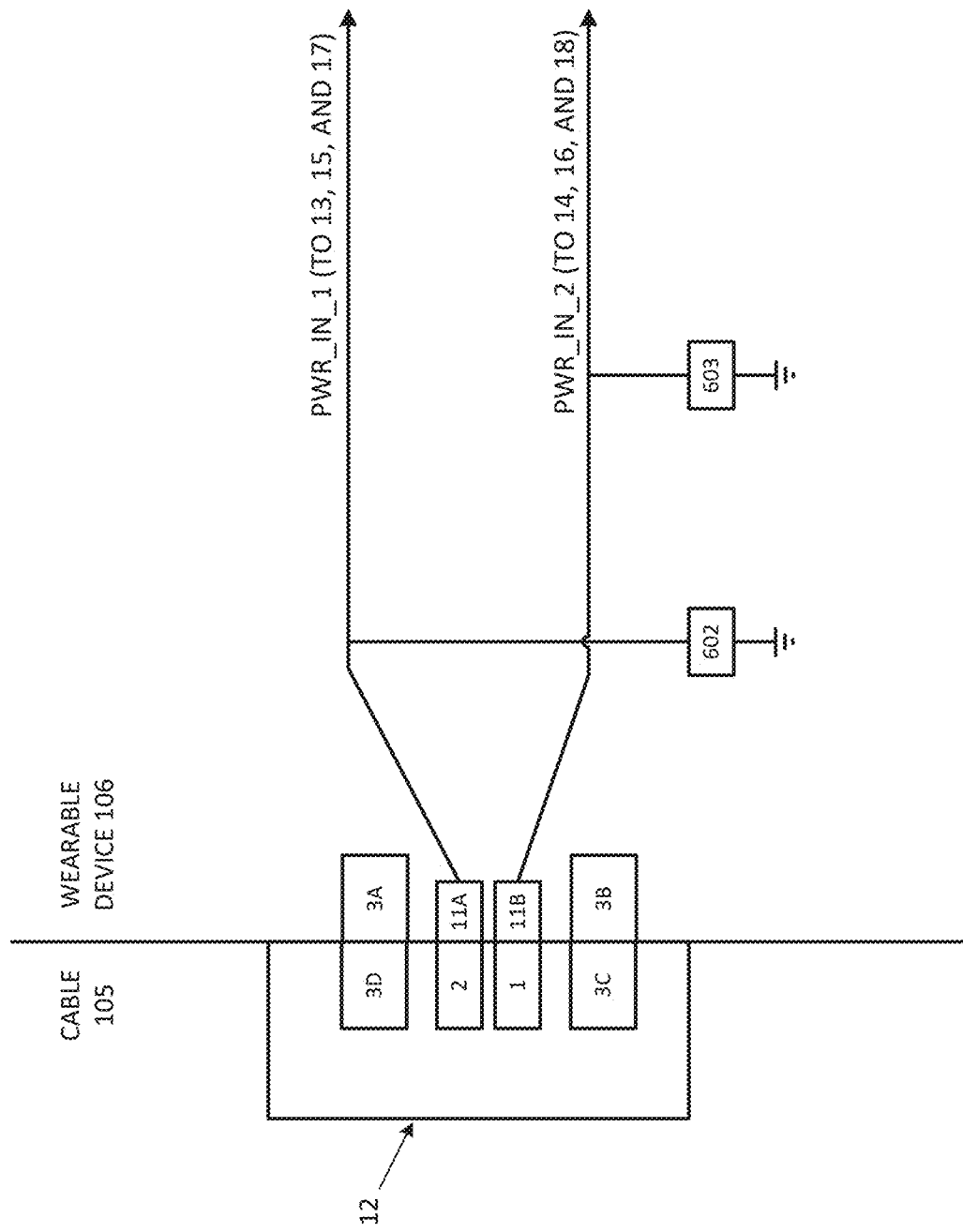
FIG. 6 is a diagram of interface connections and circuitry for a wearable device and an associated charge and wired control cable, in accordance with some example embodiments.

FIG. 6 is a diagram of interface connections and circuitry for a wearable device and an associated charge and wired control cable, in accordance with some example embodiments. FIG. 6 shows an interface with elements of the cable 105 on one side and elements of the wearable device 106 on the other side. FIG. 6 includes the connector 12 (e.g., a cable head) attached to the contact interface of the wearable device 106, similar to the system shown in FIG. 5. In FIG. 6, the four magnetic contacts 3A-D keep the connector 12 and the contact interface of the wearable device 106 coupled as pins 1 and 2 (e.g., pogo pins) physically connect with contact pads 11A and 11B. Contact pad 11A is coupled to a first power-in path, shown as PWR_IN_1, that leads to paths 13, 15, and 17 of FIG. 7 in one embodiment. Similarly, contact pad 11B is coupled to a second power-in path PWR_IN_2 that leads to paths 14, 16, and 18 of FIG. 7. Each power-in path is connected to the device ground via electrostatic discharge (ESD) protection diodes 602 and 603. In one embodiment, the ESD protection for each path comprises one or more diodes. Such diodes protect the circuitry of the wearable device from improper power from the cable head, or from potential static discharges from a user touching contact pads 11A, 11B.

In various devices, the NFET 22, 26 and PFET 20, 24 devices are low-resistance field effect transistor (FET) devices. The devices are designed such that when a DC input is received at contact pads 11A, 11B (e.g., via a connected cable with pins 1, 2), the input with the losses from the ESD diodes is sufficient to turn on the FETs. As described above, regardless of the orientation of the voltage incoming on contact pads 11A and 11B, the FETs are configured to start through the diodes as illustrated in the detail of FIG. 6.

Figure 7:
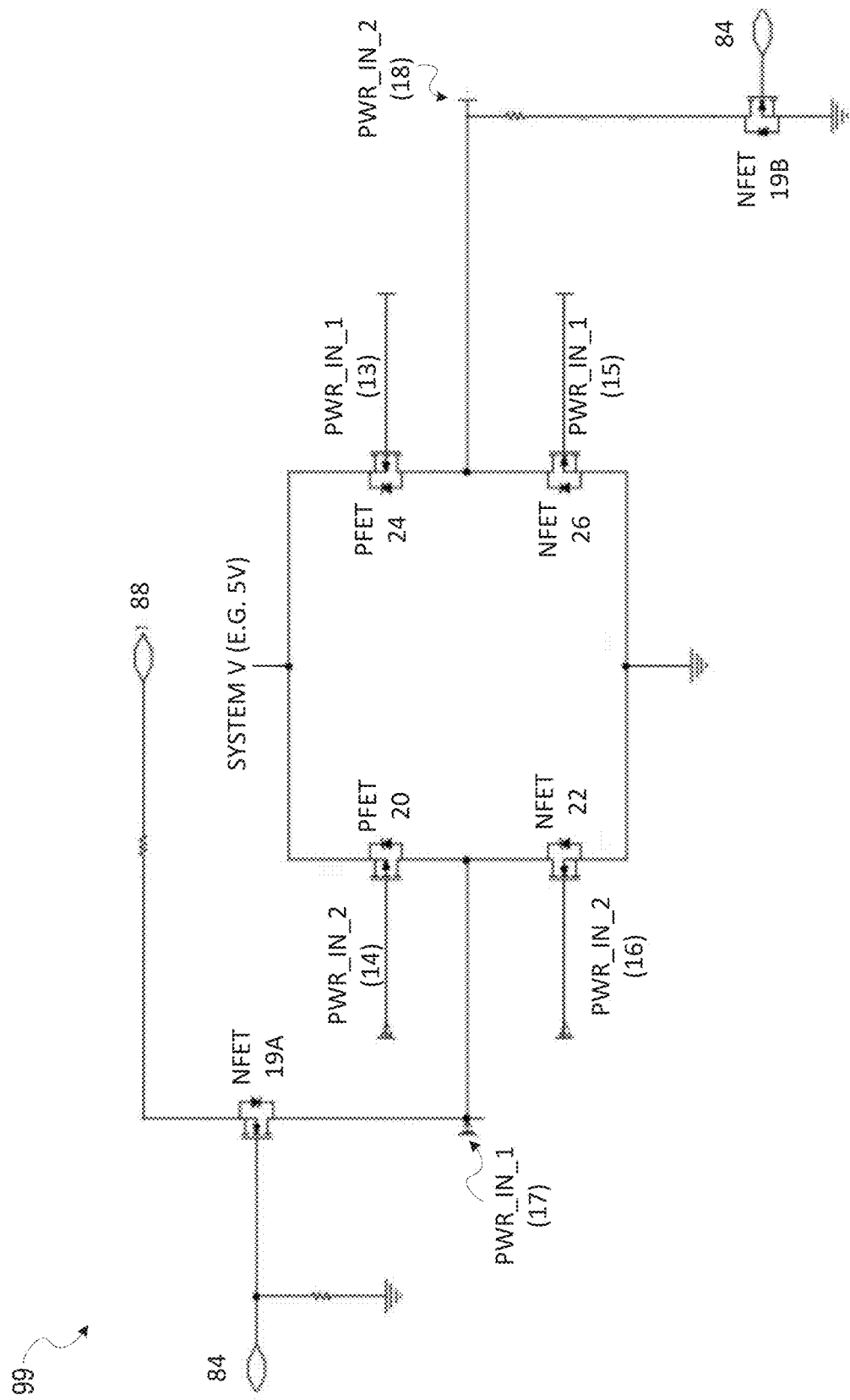
FIG. 7 is a schematic of an electrical circuit for device charging and wired control communications, in accordance with some example embodiments.

FIG. 7 shows a diagram for a circuit 99. In various embodiments, the circuit 99 is positioned within the front piece 106A of the glasses, as detailed in the embodiments described above. Power-in 1 path 13, power-in 1 path 15, and power-in 1 path 17 are all coupled by a conductive path with contact pad 11A via power-in path of FIG. 6. Power-in 2 path 14, power-in 2 path 16, and power-in 2 path 18 are all connected by conductive paths to contact pad 11B via power-in path PWR_IN_2 of FIG. 6. An input 84 is connected to control circuitry (e.g., a central processor 221, described below with reference to FIG. 17) that controls whether the circuit 99 is in a charging mode or in a data communication mode. When the circuit 99 is in a charging mode, the input 84 is off to enable the charging mode by controlling NFETs 19A and 19B. In the charging mode, the p-type and n-type field effect transistors (PFETs 20, 24 and NFETs 22, 26 respectively) are configured to receive power from contact pads 11A and 11B via pins 1 and 2 of a cable (e.g. cable 105), with the operation depending on the orientation of the connector coupled to the contact pads. In the charging mode, when a direct current (DC) voltage is presented to contact pads 11A and 11B (e.g., via pins 1 and 2), regardless of the polarity of the incoming voltage on paths 13, 15, and 17 from contact pad 11A and paths 14, 16, and 18 from contact pad 11B, the circuit 99 provides a current to charge a battery of the wearable device glasses 31, the glasses of FIGS. 2-5, etc.).

In a communication mode, contact pad 11A is configured to receive data, and contact pad 11B is configured to be attached to ground. In this mode, the input 84 is on, enabling the data path through contact pad 11A to communicate with the control circuitry of the device via an input/output (I/O) 88. The input signal is not sufficient for the PFET 20 and the NFET 22 to interfere with the data communicated to the control circuitry via the I/O 88. Thus, in the communication mode, control circuitry of the device sends and receives signals via the I/O 88 to an attached cable through power-in 1 path 17, and power-in 2 path 18 is the corresponding ground for the data signal on power-in 1 path 17. The control circuitry of the device may communicate data in the communication mode with a controlling device, which may be a test or control device similar to the device 102 or debug device 104 and coupled to the circuit 99 via a cable such as the cable 105 of FIGS. 3A and 3B.

In various devices, the NFET 22, 26 and PFET 20, 24 devices are low-resistance field effect transistor (FET) devices. The signal on the input 84 may be managed to transition between the charging mode and the communication mode in a variety of different ways. In the embodiment of FIG. 7, NFETs 19A and 19B are controlled to manage the transition. In some embodiments, the device alternates on a periodic schedule between a charging mode and a communication mode. In some embodiments, for example, the circuit 99 is configured for charging during 0.9 seconds out of every second, with the remaining tenth of the second dedicated to communication. In other embodiments, other such communication schedules may be used. This allows slower charging with some wired communication. In some embodiments, a schedule or trigger is set using wireless communications. In some embodiments, a hard reboot of all elements of a wearable device is performed, and such a hard reboot places the device into a communication mode, a debug mode, or a partial (e.g., scheduled or periodic) communication mode. In some embodiments, the scheduling or configuration of the communication mode is based on an available battery charge. In some such embodiments, an initial charge period occurs after connection of the charge cable, and the communication mode is activated only after a certain charging time or battery level threshold.

In another embodiment, wireless communications with control circuitry of a device may be used to determine the device mode. In some embodiments, the device automatically enters the communication mode or a periodic communication mode, and remains in the communication mode until the charging mode or a full-time charging mode is activated either via wired communication using the I/O 88 or via a separate wireless communication system. In such embodiments, after the device transitions to the full-time charging mode, wired communication with the I/O 88 is unavailable unless the device is reset or a wireless command is received. Such systems enable the use of wired communications in a device during manufacture and initial testing, but make wired communication unavailable after the device is placed in the full-time charging mode. Such systems can prevent user access to certain device functionality that is used during manufacturing and initial device testing.

FIGS. 8-13 describe aspects of device state management as part of a system for wired charging and communication using a two-line wired connection to a wearable device (e.g., the connection described above with reference to FIGS. 2-7). These figures describe operations of embodiments involving software and hardware to provide charging and bi-directional communication capabilities over a two-wire charging port (e.g., a symmetric contact interface) such as the interface described above with reference to FIGS. 2-7 for a wearable device. The below embodiments use time division of access to the charging port in order to achieve the goals of charging and communication over the two-wire interface. For example, in some embodiments, the wearable device 106 is connected to specialized debug hardware such as the debug device 104 via a custom cable 105 as described above. The debug device 104 is then connected to a computer via a cable (e.g., device 102 via cable 103 which may be a mini-USB cable).

Figure 8:
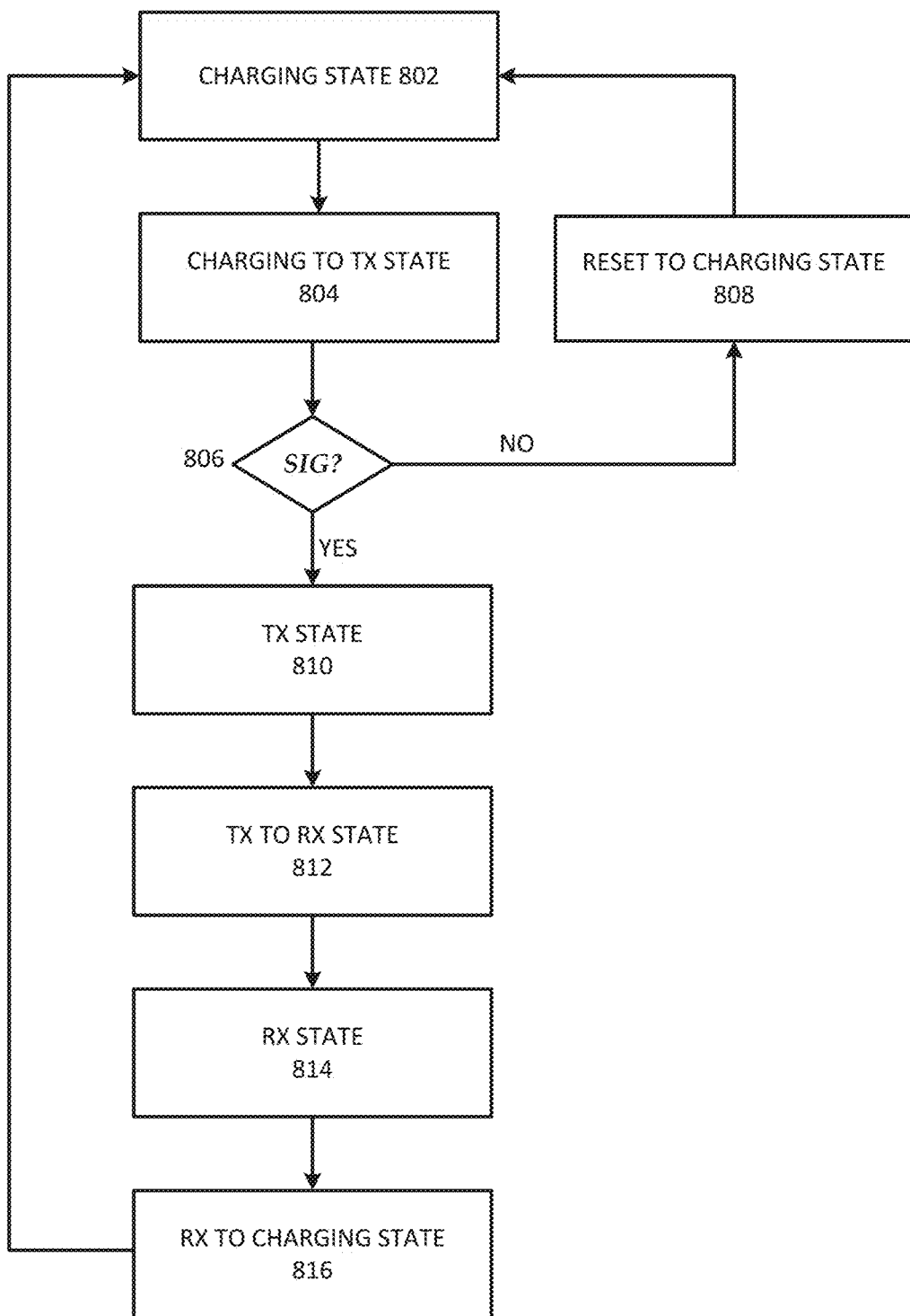
FIG. 8 is a flow chart illustrating aspects of device charging and wired control communications, in accordance with some example embodiments.
Figure 9:
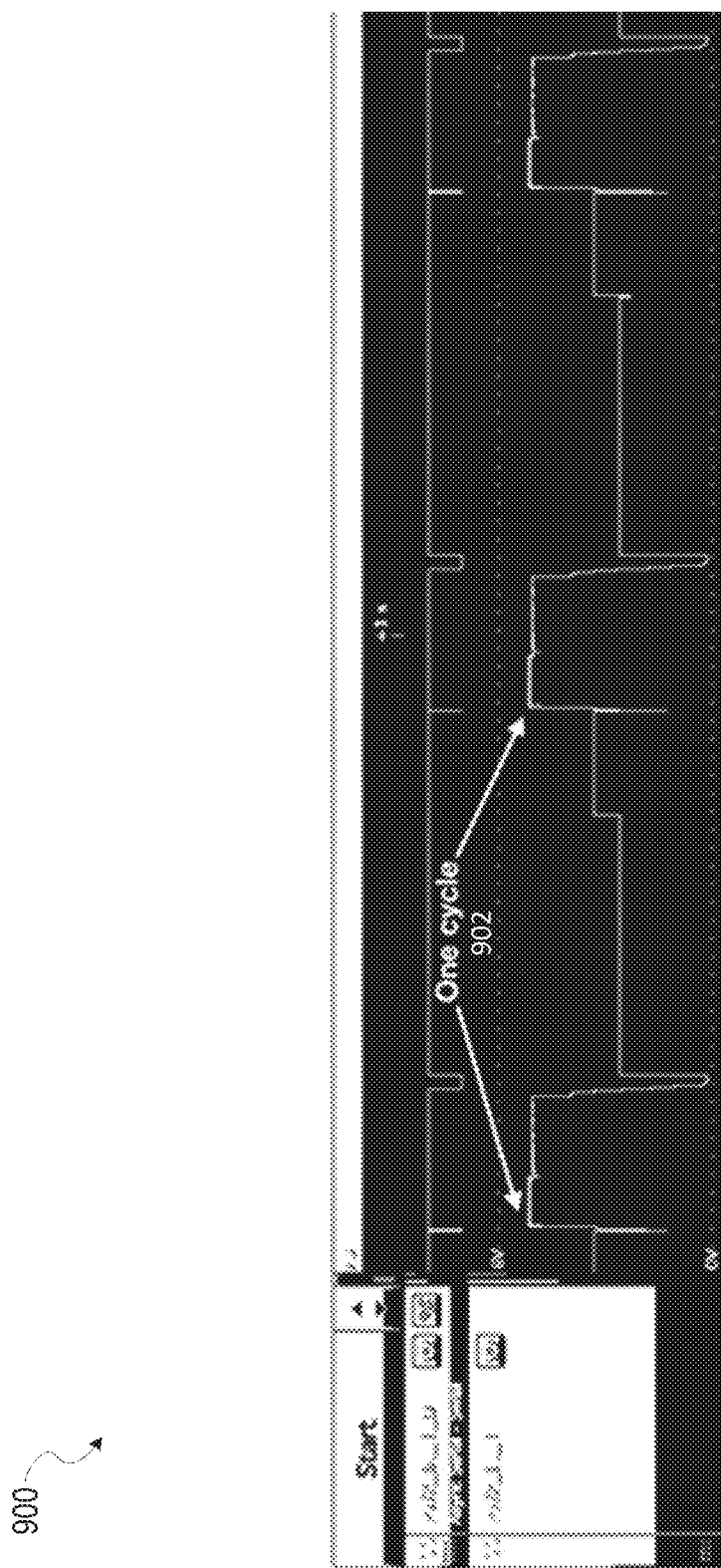
FIG. 9 illustrates aspects of device states and signaling for charging and communications with a wearable device, in accordance with some embodiments.

FIG. 8 is a flow chart illustrating aspects of device charging and wired control communications, in accordance with some example embodiments. In various embodiments, the system operates in a plurality of different states, with operating states for communication and for charging via a charging interface and charge cable. In some embodiments, the system operates in a charging state where a wearable device receives a charge for a charge period. Following the charge period, a determination is made as to whether communication data is to be communicated via the charging interface and charge cable. If so, the system cycles through a set of communication states to allow data transmission and reception on the two-wire line across the charging interface and charge cable. If not, the charging period is repeated. FIG. 8 particularly describes an embodiment of a system for time division management of the charging port, and the associated device states for different communication and charging operations that use the port. FIGS. 9-13 illustrate example signals on a two-line connection at a charge interface of a wearable device. FIG. 9 in particular shows a signal display 900 illustrating more than two cycles through the states of a wearable device as indicated by the signal at a charge interface (e.g., a signal between charge contacts such as contact pads 11A and 11B). Cycle 902 is particularly shown, and the pattern of cycle 902 can be seen to be repeated in the signal display 900. Additional details of signals during various device states are shown in more detail in FIGS. 10-13.

The flow chart of FIG. 8 starts with a charging state 802. Prior to the system entering the charging state 802, system checks may be performed to verify that the system is operating correctly. For the charging state 802, the debug device may configure relays for charging and maintain the relays for charging for a set period of time (e.g., 300 ms, 1 s, etc.). In some embodiments, the charging state 802 is the default state for a wearable device with a cable head connected to the charging interface. In the charging state 802, the wearable device is configured to provide charge from the charging interface to a battery. The wearable device remains in the charging state 802 until the wearable device sees a charger disconnect interrupt, and then proceeds to the next state (e.g., a charging to Tx state 804). The charger disconnect interrupt can be triggered either by the debug device or by physical disconnection of the charge cable. In some embodiments, an indicator, such as a light-emitting diode, indicates when the wearable device is in the charging state 802.

After the charging period is complete, the debug device waits for a signal from the wearable device as part of a charging to transmit data (Tx) state 804. As discussed herein, the states are referred to from the perspective of the computing device or debug device, such that the receive (Rx) state refers to the wearable device transmitting data, while the computing/debug device receives data from the wearable device. Similarly, the Tx state refers to the computing device or debug device transmitting data and the wearable device receiving data from the computing/debug device.

After the charging state 802 and during the transitional charging to Tx state 804, the debug device waits for a signal from the wearable device. This may be a set waiting period (e.g., 250 ms, 500 ms, 50 ms, etc.), and the signal may be, for example, the wearable device pulling the voltage at the charge interface (e.g., across contact pads 11A, 11B) to a low voltage (e.g., pulling the line low). If this signal is not detected during a sensing period as part of operation 806, then the system transitions to a reset to charging state 808, which simply involves placing the debug device back in a configuration (e.g., switch settings and any preliminary sensing to confirm appropriate configurations) to provide a charge to the wearable device. During the reset to charging state 808, the debug device may, in some embodiments, reset (e.g., disconnect or turn off) all relays for a set period of time (e.g., 50 ms, 100 ms, etc., depending on the system characteristics), while the wearable device simply returns to the charging state 802 and remains there until another charger disconnect interrupt is detected.

If the transition signal is detected in operation 806 as part of the charging to Tx state 804, depending on the particular hardware, any variation due to a need to reconfigure the wearable device to communicate data instead of receiving a charge, or any other such time-dependent operations of a wearable device, may delay a response to the charger disconnect interrupt. When the wearable device is ready to transition to a Tx state, the wearable device sends a transition signal to the debug device (e.g., "yes" for signal operation 806). This signal may, for example, involve pulling the line across the contact pads to a low voltage, as mentioned above. This signal acts as both an indication to the debug device and a time reference for synchronizing data communications. Additionally, in some embodiments, during the transitional charging to Tx state 804, a capacitor across the contact pads is discharged so that the signal across the two lines to the debug device is clean.

Figure 10:
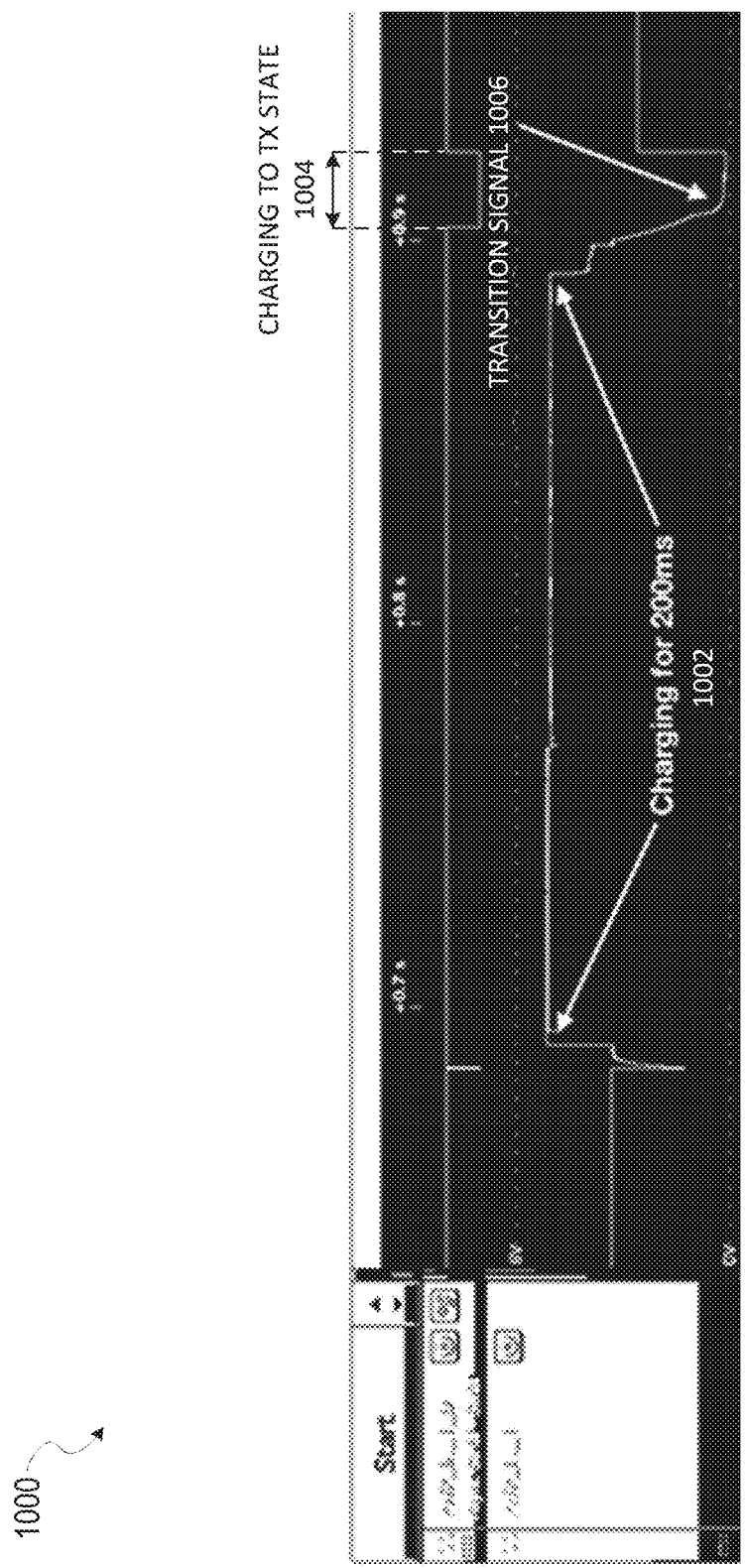
FIG. 10 illustrates aspects of device states and signaling for charging and communications with a wearable device, in accordance with some embodiments.

FIG. 10 shows a signal display 1000, which displays details of a signal across contact pads of the charge interface. The signal display 1000 particularly shows a first period of charging 1002, followed by a pull-down transition signal 1006 where the wearable device pulls the signal low during a time period for a charging to Tx state 1004.

Once the transition is completed, with the transition signal generated by the wearable device and detected by the debug device, the system cycles through a plurality of communication states. FIGS. 8-13 illustrate a particular set of states, with Tx before Rx, but in different embodiments, any order or any combination of states may be present. For example, in some embodiments, only Tx or only Rx may occur between some charging state periods. In other embodiments, multiple transitions between Tx and Rx states may occur without an intervening transition to the charging state. In the embodiment of FIG. 8, a Tx state 810 occurs first with the corresponding charging to Tx state 804. In other embodiments, a charging to Rx state may occur before the transition signal from the wearable device.

In the Tx state 810, data from the debug device and/or computing device is sent to the wearable device. If the Tx state is scheduled for a set transition time period, and not enough time is available to send all of the buffered data, the unsent data will be held until a next cycle. During the Tx state 810, the wearable device is configured to receive data and parse data to identify commands to be carried out by the wearable device. This may include commands to activate sensors or transceivers of the wearable device, which may include any system described herein. This may also include commands to store transmitted data, or to transmit data (e.g., content data such as images or video) from the wearable device during a later Rx state.

Correspondingly, in an Rx state 814, data from the wearable device is sent to the debug device (e.g., and relayed to a computing device by the debug device, if these are separate devices). If the Rx state 814 is set for a set period that does not allow the wearable device to communicate all needed data, the remaining data is held for a next cycle. In some embodiments, the use of fixed Tx and Rx periods limits the need for additional signaling and synchronization after the transition signal of operation 806 is used to synchronize the wearable device with the debug device. In the Rx state 814, the debug device opens a serial port and checks for data sent by the wearable device. For the wearable device, in some embodiments the processors may respond to long blocking commands received during the Tx state 810 which prevent the wearable device from sending at the beginning of the Rx state 814. In such embodiments, the wearable device may delay sending data until a next Rx state 814 in the repeated cycle if a threshold amount of time in the Rx state 814 is not left. If sufficient time is left in the period for the Rx state 814, the wearable device transmits data from a buffer to the debug device.

Additionally, further transition states are present depending on the cycle order through the communication states. In FIG. 8, following the Tx state 810, a Tx to Rx state 812 is used to allow reconfiguration of relays for transmitting data at the debug device, and reconfiguration of pins (e.g., circuitry) at the wearable device to receive data.

Following completion of the final communication state for a particular cycle, a communication to charging transition occurs, shown as an Rx to charging state 816 in FIG. 8. In some such embodiments, for securing settings, the debug device closes communications and sets all relays to off to allow the communication line (e.g., across the contact pads and along the charge cable) to fall to zero. Following a threshold time period (e.g., 30 ms, 50 ms, etc.), the debug device returns to the charging state 802. The wearable device additionally reconfigures internal circuitry to a charging state from a data communication state, and the process repeats, with the wearable device in the charging state 802 until a charge disconnect interrupt is received.

FIG. 8 thus illustrates one example embodiment of a system for wired communication and charging of a wearable device. In some embodiments, each of the states 802, 804, 808, 810, 812, 814, and 816 is associated with a fixed time period, with the times synchronized between the computing device and the wearable device performing the operations of the various states by the signal of operation 806 (e.g., a pull-down from the wearable device). As described above, if some states are not able to complete data transfer during the fixed time associated with a particular embodiment, the remaining data is transferred during a next cycle through the states (e.g., as shown by cycle 902 of FIG. 9). In other embodiments, certain states are associated with fixed time periods, while other states are not. Similarly, some states may have a fixed time period during certain circumstances, and not during others. For example, an initial charge state after a connection between a cable and a charge interface of a wearable device may have a fixed time period, while subsequent charge states do not, with the subsequent charge states ending with a charge disconnect interrupt. Various different embodiments may have any combination of the operations above.

Figure 11:
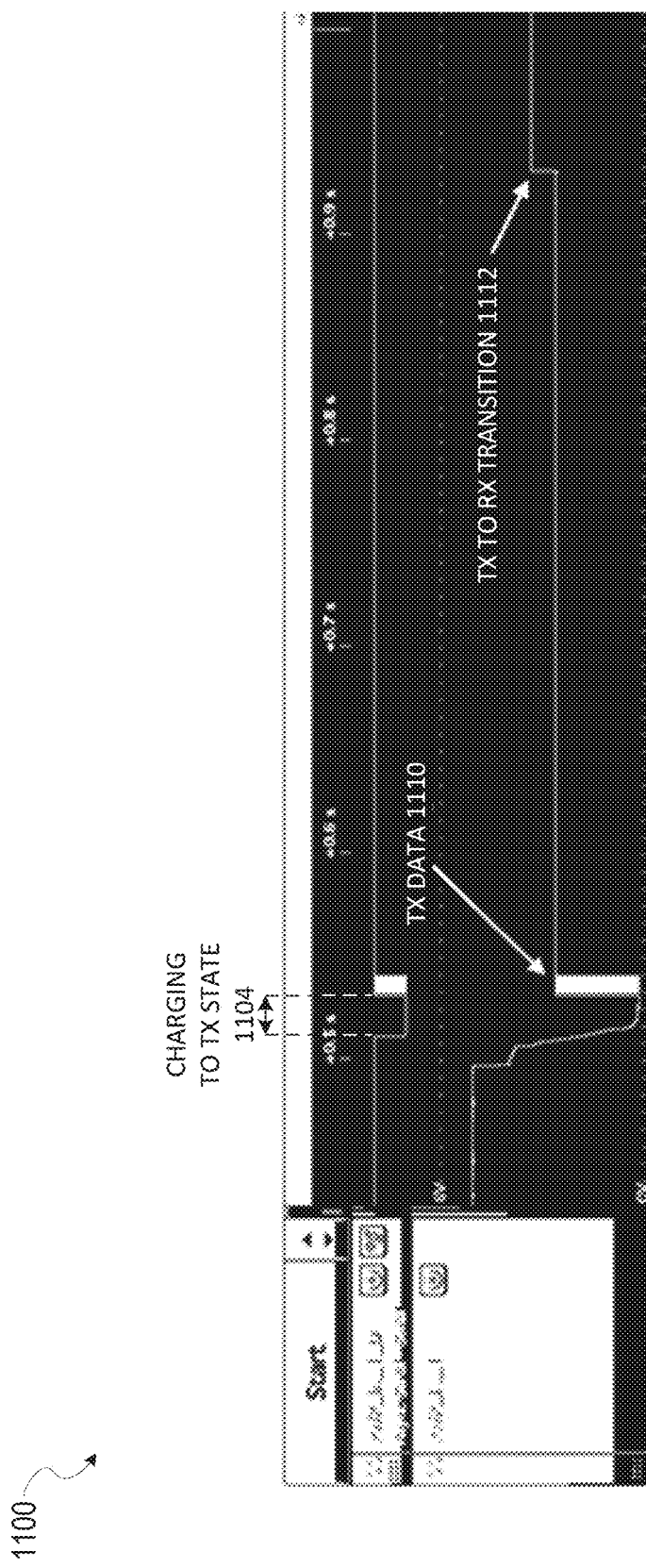
FIG. 11 illustrates aspects of device states and signaling for charging and communications with a wearable device, in accordance with some embodiments.
Figure 12:
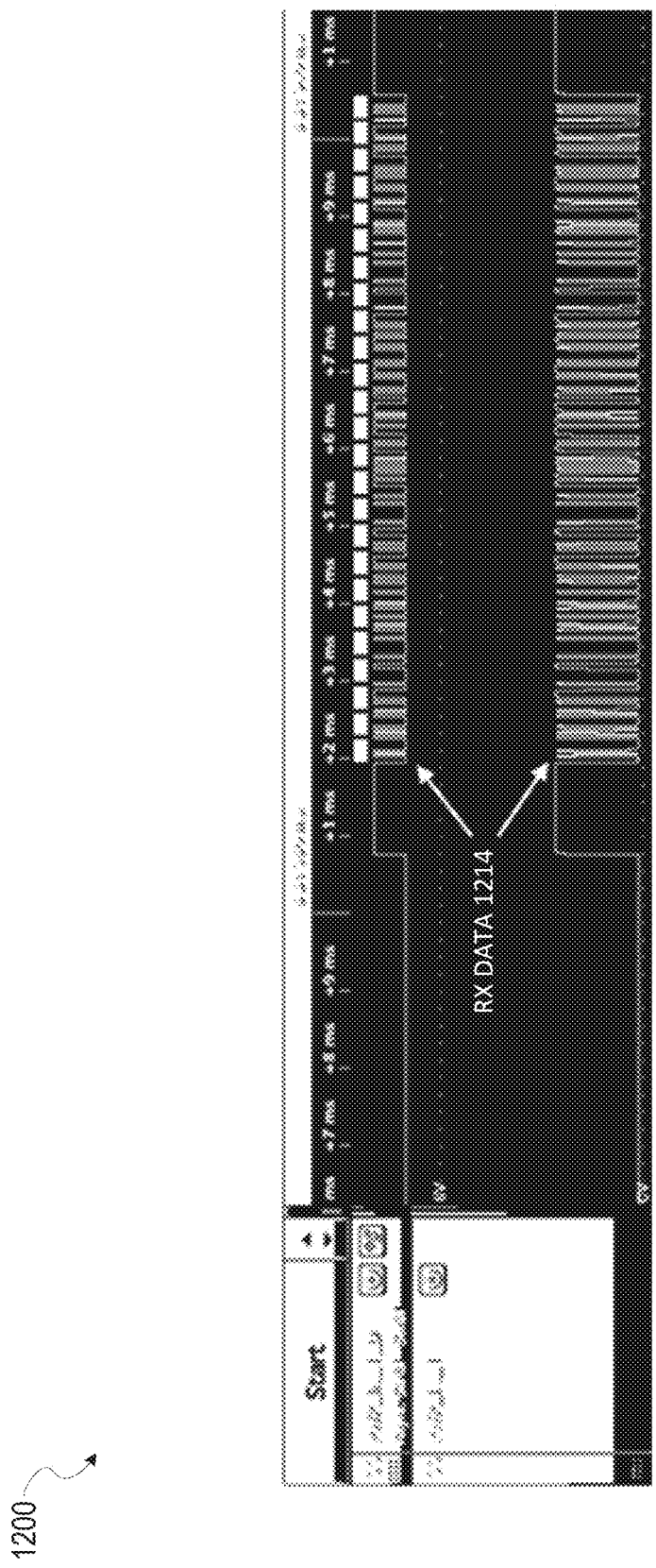
FIG. 12 illustrates aspects of device states and signaling for charging and communications with a wearable device, in accordance with some embodiments.
Figure 13:
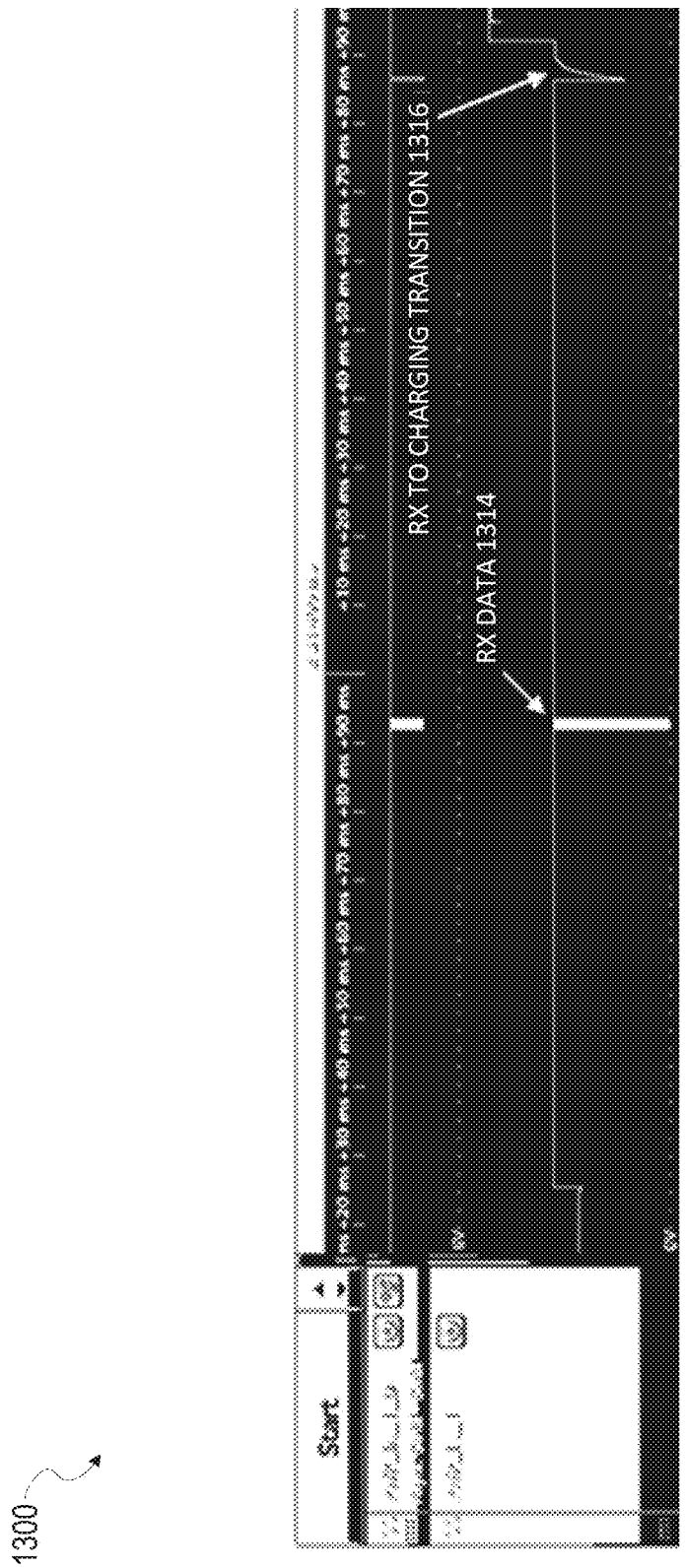
FIG. 13 illustrates aspects of device states and signaling for charging and communications with a wearable device, in accordance with some embodiments.

FIGS. 9-13 illustrate the above states. As detailed above, the signal display 900 illustrates more than two cycles through periodic repetition of states, and the signal display 1000 illustrates a first period of charging 1002 of 200 ms as part of a charging state, followed by a pull-down transition signal 1006 during a charging to Tx state 1004. A signal display 1100 of FIG. 11 shows a continuation of such signals in accordance with various embodiments, with Tx data 1110 received following a charging to Tx state 1104 transition, which is further followed by a Tx to Rx transition 1112 indicator as part of a Tx to Rx transition state. A signal display 1200 of FIG. 12 shows Rx data 1214 received during an Rx state, and a signal display 1300 of FIG. 13 shows Rx data 1314 followed by an Rx to charging state transition 1316 indicator as part of an Rx to charging state. Following this, the system returns to the charging state, either to repeat the cycle, or to remain in the charging state, depending on system operations. The cycle illustrated by cycle 902 of FIG. 9 may, in some embodiments, be repeated any number of times in a fixed periodic repetition. In other embodiments, any time periods may occur between different cycles, with charging state periods not having a fixed duration occurring between the different cycles of fixed-time-period communication states. In other embodiments, any communication state periods may be set by system controls.

Figure 14:
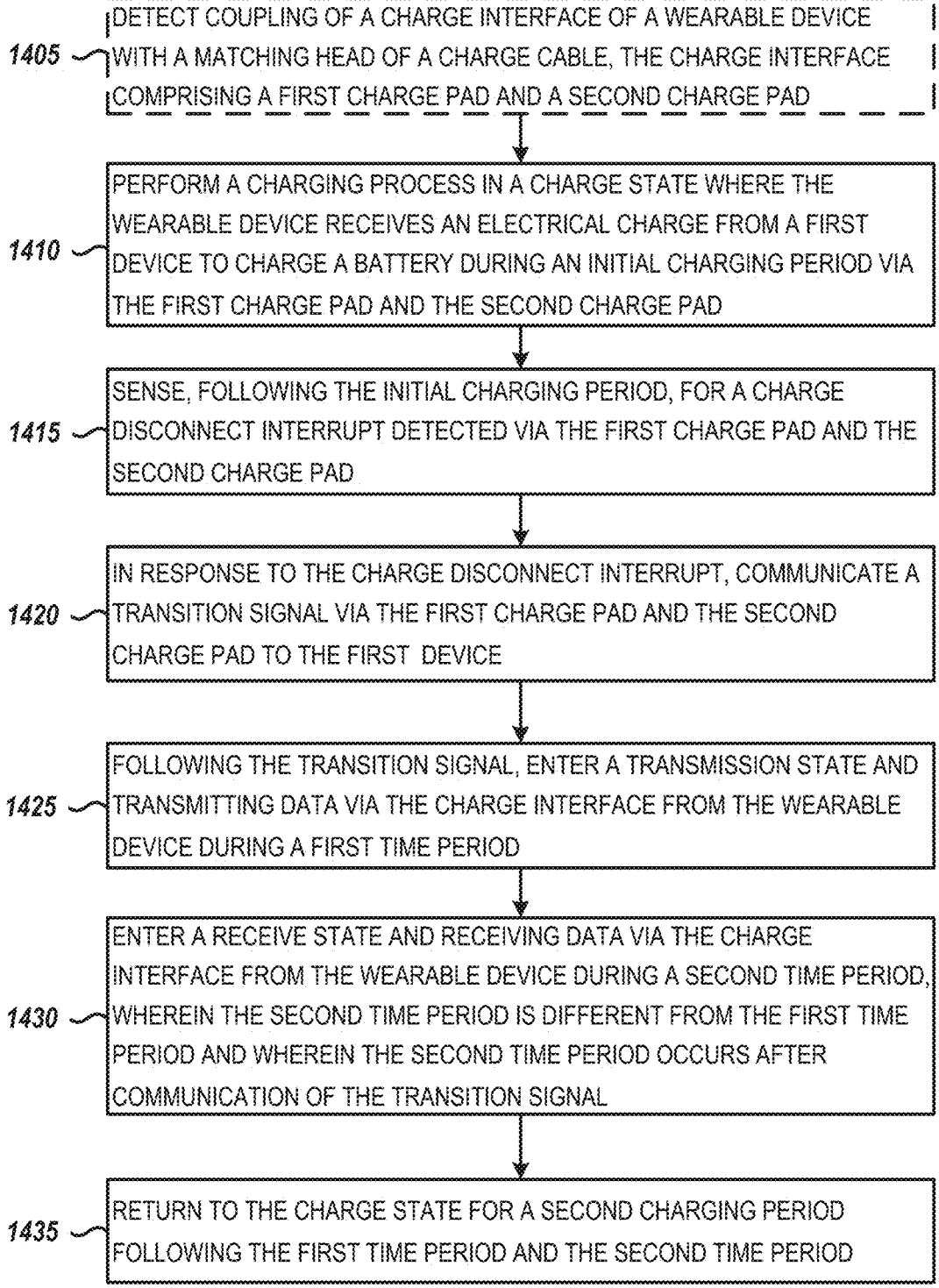
FIG. 14 illustrates a method for wearable device charging and wired control, in accordance with some embodiments.

FIG. 14 illustrates a method 1400 for charging and wired control. In some embodiments, the method 1400 is performed by a wearable device and one or more processors or control circuitry of the wearable device. In other embodiments, the method 1400 is implemented as a set of instructions stored in a storage medium, where the instructions cause a wearable device to perform the method 1400. In some embodiments, aspects of the method 1400 may be performed by a test system used for testing aspects of a wearable device.

For the method 1400, optional operation 1405 begins with the wearable device detecting coupling of a charge interface with a matching head of a charge cable, the charge interface comprising a first charge pad and a second charge pad. In other embodiments, the method 1400 may be initiated by controls of a computing device or debug computing device (e.g., any combination of the device 102 or the debug device 104, or any such device described herein). The charge interface may be an asymmetrical charge interface, as described above.

After the cable is connected to the charge interface, operation 1410 proceeds with the wearable device performing a charging process in a charge state where the wearable device receives an electrical charge from a first device to charge a battery during an initial charging period via the first charge pad and the second charge pad.

The wearable device then senses, following the initial charging period, for a charge disconnect interrupt detected via the first charge pad and the second charge pad as part of operation 1415. In some embodiments, this sensing may occur throughout the charging period or as part of the charge state. In other embodiments, the sensing occurs during a transition state.

In operation 1420, in response to the charge disconnect interrupt, the wearable device communicates a transition signal via the first charge pad and the second charge pad to the first device. Following the transition signal, in operation 1425 the wearable device enters a transmission state and transmits data via the symmetrical interface from the wearable device during a first time period. Similarly, in operation 1430 the wearable device enters a receive state and receives data via the symmetrical interface from the wearable device during a second time period, wherein the second time period is different from the first time period and wherein the second time period occurs after communication of the transition signal. In some embodiments, the receive state occurs before the transmission state to allow the wearable device to receive commands and to respond to the commands with data in the transmission state as part of a particular device cycle. In other embodiments, other state ordering is used. Following completion of the transmission and receive states, the wearable device returns to the charge state in operation 1435 for a second charging period following the first time period and the second time period.

Figure 16:
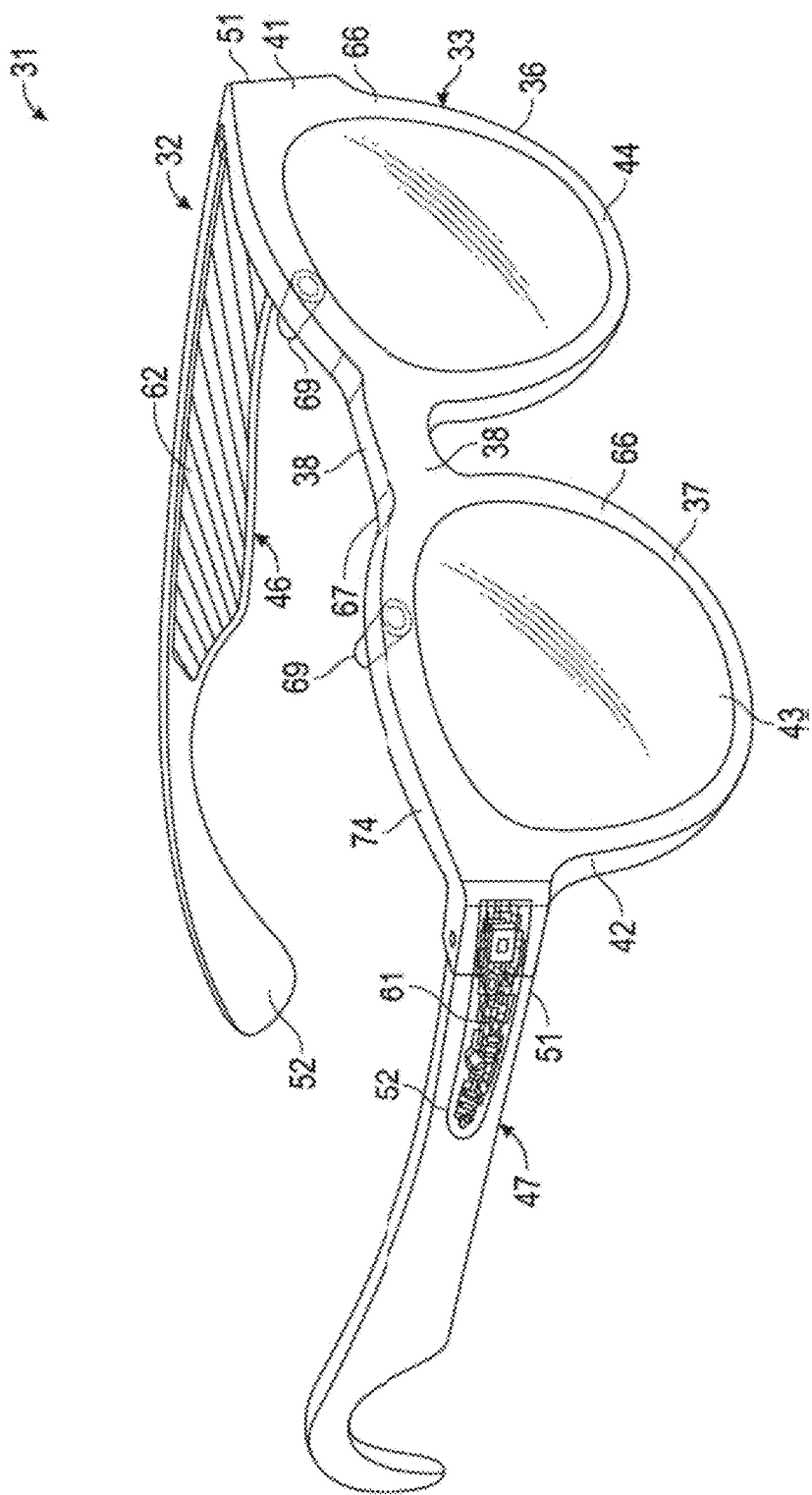
FIG. 16 illustrates a wearable device for use in accordance with various embodiments described herein.
Figure 17:
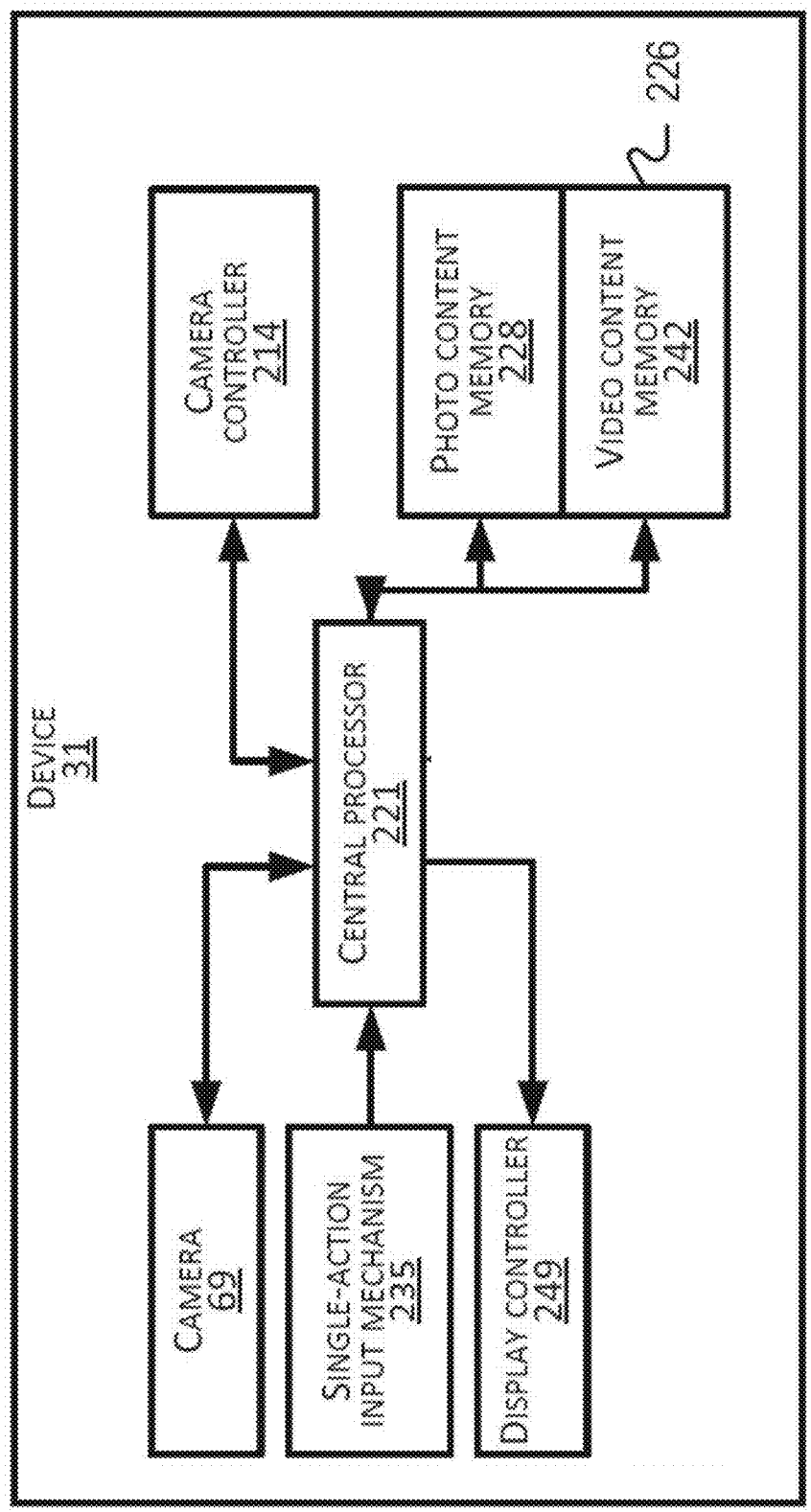
FIG. 17 illustrates aspects of a wearable device, in accordance with some embodiments described herein.

In some such embodiments, the wearable device operates where the charge interface comprises a symmetrical interface configured to accept a coupling with a matching head of a charge cable in a plurality of attachment positions. As described above with reference to FIGS. 2-6, some embodiments operate where the charge interface further comprises a plurality of magnets configured to maintain the coupling of the charge interface with the matching head of the charge cable by maintaining a force greater than an opposing force generated by springs of a set of pogo pins of the matching head configured to connect with the first charge pad and the second charge pad. In some embodiments, the wearable device performing the method 1400 comprises a pair of glasses with a glasses front piece, the glasses front piece comprising a temple, and the temple comprising a hinge and the charge interface, wherein an arm coupled to the hinge is configured to cover the charge interface when the arm is in an open position and to uncover the charge interface when the arm is in a closed position. FIGS. 16 and 17 illustrate an example pair of such glasses, though other glasses and other wearable devices may perform aspects of the method 1400 in accordance with various different embodiments.

Figure 15:
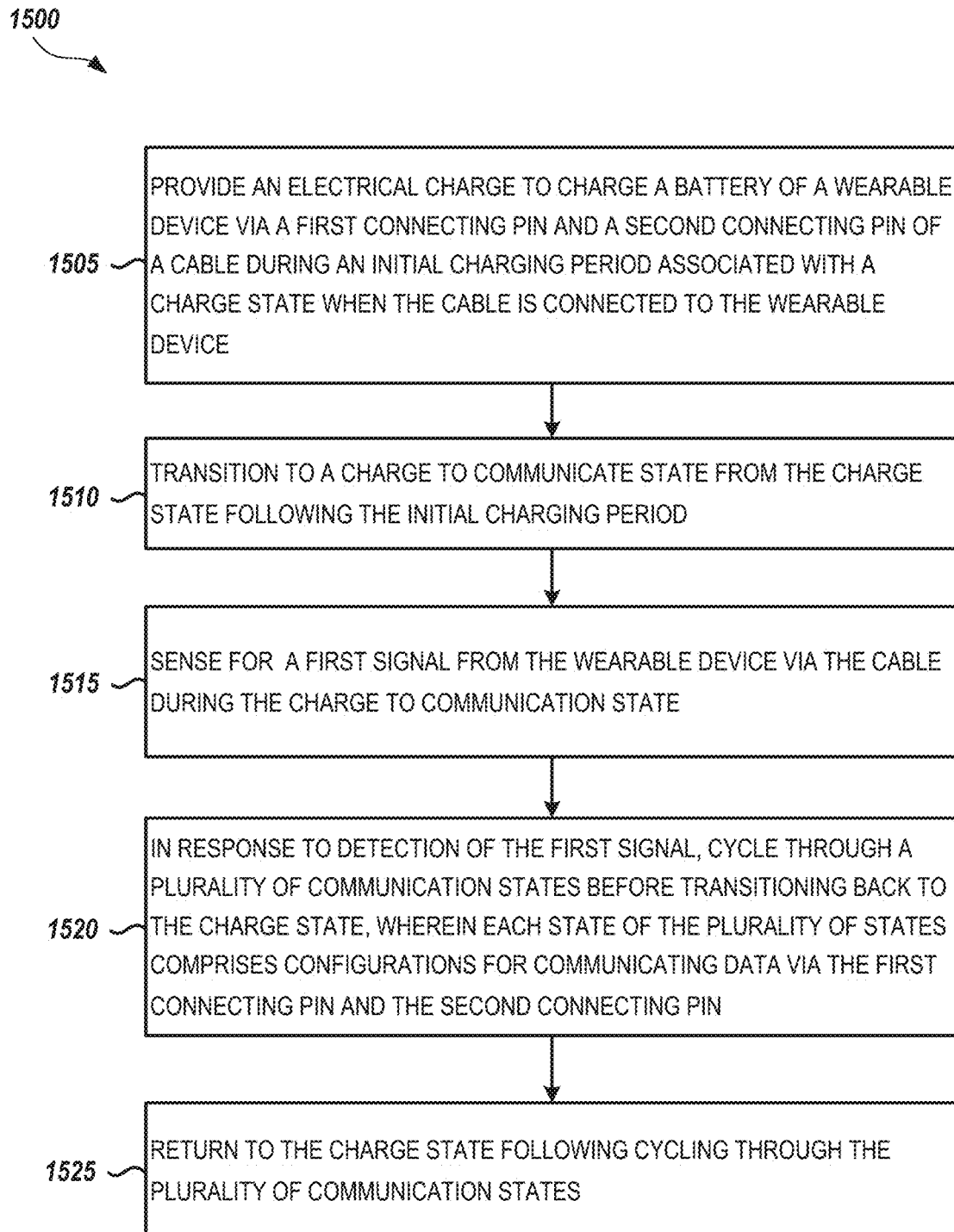
FIG. 15 illustrates a method for wearable device charging and wired control, in accordance with some embodiments.

FIG. 15 describes a method 1500 that corresponds to operations that may be performed by a test system, computing device, or debug device (e.g., a combination of the device 102, the debug device 104, or any other such computing device described herein) while an apparatus of a wearable device performs the method 1400. In some embodiments, the method 1500 is embodied as computer-readable instructions that, when executed by one or more processors of a computing device, cause the device to perform operations of the method 1500.

After a cable is connected from the device performing the method 1500 to a charge interface of a wearable device, the method 1500 begins with operation 1505 and the device providing an electrical charge to charge a battery of the wearable device via a first connecting pin and a second connecting pin of the cable during an initial charging period associated with a charge state when the cable is connected to the wearable device. In operation 1510, the device transitions to a charge to communicate state from the charge state following the initial charging period, and senses for a first signal from the wearable device via the cable during the charge to communicate state in operation 1515. In response to detection of the first signal, operation 1520 involves cycling through a plurality of communication states before transitioning back to the charge state, wherein each state of the plurality of communication states comprises configurations for communicating data via the first connecting pin and the second connecting pin. As described above, this may involve different combinations of cycling through different communication states, with different timings associated with the different states. Following the end of the periods for the communication states, operation 1525 involves a transition of returning to the charge state following cycling through the plurality of communication states.

The method 1500 describes operations where the device (e.g., the device 102 or the debug device 104) is connected via a functioning cable to a functioning wearable device. In some systems, the cable may be damaged, or the wearable device may not function correctly. In such circumstances, the device attempts to provide a second electrical charge to charge the battery of the wearable device via the first connecting pin and the second connecting pin during a second charging period following the return to the charge state. Following this second charging period, the device transitions to a second charge to communicate state from the charge state, and senses for a transition signal from the wearable device via the cable during the second charge to communicate state. Due to the failure or lack of connection, the device does not detect the transition signal. In response to a failure to detect the transition signal during a fixed time associated with the second charge to communicate state, the device returns to the charge state without transitioning to a communication state of the plurality of communication states.

Various aspects and alternative configurations will now be described with reference to more detailed example embodiments. FIGS. 16-19 illustrate an example embodiment of a wearable electronic device implementing various disclosed techniques, the electronic device being in the example form of an article of eyewear constituted by electronics-enabled glasses 31, which may further operate within a network system 1800 or 1901 for communicating image and video content. FIG. 16 shows a front perspective view of the glasses 31 which, in accordance with this example embodiment, include one or more circuits such as the circuits of FIGS. 6 and 7 for charging and wired control of a wearable device.

The glasses 31 can include a frame 32 made from any suitable material such as plastic or metal, including any suitable shape memory alloy. The frame 32 can have a front piece 33 that can include a first or left lens, display, or optical element holder 36 and a second or right lens, display, or optical element holder 37 connected by a bridge 38. The front piece 33 additionally includes a left end portion 41 and a right end portion 42. A first or left optical element 43 and a second or right optical element 44 can be provided within respective left and right optical element holders 36, 37. Each of the optical elements 43, 44 can be a lens, a display, a display assembly, or a combination of the foregoing. In some embodiments, for example, the glasses 31 are provided with an integrated near-eye display mechanism that enables, for example, display to the user of preview images for visual media captured by cameras 69 of the glasses 31.

The frame 32 additionally includes a left arm or temple piece 46 and a right arm or temple piece 47 coupled to the respective left and right end portions 41, 42 of the front piece 33 by any suitable means such as a hinge (not shown), so as to be coupled to the front piece 33, or rigidly or fixably secured to the front piece 33 so as to be integral with the front piece 33. Each of the temple pieces 46 and 47 can include a first portion 51 that is coupled to the respective end portion 41 or 42 of the front piece 33 and any suitable second portion 52, such as a curved or arcuate piece, for coupling to the ear of the user. In one embodiment, the front piece 33 can be formed from a single piece of material, so as to have a unitary or integral construction. In one embodiment, the entire frame can be formed from a single piece of material so as to have a unitary or integral construction.

The glasses 31 can include a computing device, such as a computer 61, which can be of any suitable type so as to be carried by the frame 32 and, in one embodiment, of a suitable size and shape, so as to be at least partially disposed in one of the temple pieces 46 and 47. In one embodiment, as illustrated in FIG. 16, the computer 61 has a size and shape similar to the size and shape of one of the temple pieces 46, 47 and is thus disposed almost entirely if not entirely within the structure and confines of such temple pieces 46 and 47. In one embodiment, the computer 61 can be disposed in both of the temple pieces 46, 47. The computer 61 can include one or more processors with memory, wireless communication circuitry, and a power source. The computer 61 comprises low-power circuitry, high-speed circuitry, and a display processor. Various other embodiments may include these elements in different configurations or integrated together in different ways. Additional details of aspects of the computer 61 may be implemented as described with reference to the description that follows.

The computer 61 additionally includes a battery 62 or other suitable portable power supply. In one embodiment, the battery 62 is disposed in one of the temple pieces 46 or 47. In the glasses 31 shown in FIG. 1, the battery 62 is shown as being disposed in the left temple piece 46 and electrically coupled using a connection 74 to the remainder of the computer 61 disposed in the right temple piece 47. One or more input and output devices can include a connector or port (not shown) suitable for charging a battery 62 accessible from the outside of the frame 32, a wireless receiver, transmitter, or transceiver (not shown), or a combination of such devices.

The glasses 31 include digital cameras 69. Although two cameras 69 are depicted, other embodiments contemplate the use of a single or additional (i.e., more than two) cameras. For ease of description, various features relating to the cameras 69 will further be described with reference to only a single camera 69, but it will be appreciated that these features can apply, in suitable embodiments, to both cameras 69.

In various embodiments, the glasses 31 may include any number of input sensors or peripheral devices in addition to the cameras 69. The front piece 33 is provided with an outward-facing, forward-facing, front, or outer surface 66 that faces forward or away from the user when the glasses 31 are mounted on the face of the user, and an opposite inward-facing, rearward-facing, rear, or inner surface 67 that faces the face of the user when the glasses 31 are mounted on the face of the user. Such sensors can include inward-facing video sensors or digital imaging modules such as cameras that can be mounted on or provided within the inner surface 67 of the front piece 33 or elsewhere on the frame 32 so as to be facing the user, and outward-facing video sensors or digital imaging modules such as the cameras 69 that can be mounted on or provided with the outer surface 66 of the front piece 33 or elsewhere on the frame 32 so as to be facing away from the user. Such sensors, peripheral devices, or peripherals can additionally include biometric sensors, location sensors, accelerometers, or any other such sensors.

The glasses 31 further include an example embodiment of a camera control mechanism or user input mechanism comprising a camera control button mounted on the frame 32 for haptic or manual engagement by the user. The camera control button provides a bi-modal or single-action mechanism in that it is disposable by the user between only two conditions, namely an engaged condition and a disengaged condition. In this example embodiment, the camera control button is a pushbutton that is by default in the disengaged condition, being depressible by the user to dispose it to the engaged condition. Upon release of the depressed camera control button, it automatically returns to the disengaged condition.

In other embodiments, the single-action input mechanism can instead be provided by, for example, a touch-sensitive button comprising a capacitive sensor mounted on the frame 32 adjacent to its surface for detecting the presence of a user's finger, to dispose the touch-sensitive button to the engaged condition when the user touches a finger to the corresponding spot on the outer surface of the frame 32. It will be appreciated that the above-described camera control button and capacitive touch button are but two examples of a haptic input mechanism for single-action control of the camera 69, and that other embodiments may employ different single-action haptic control arrangements.

Figure 18:
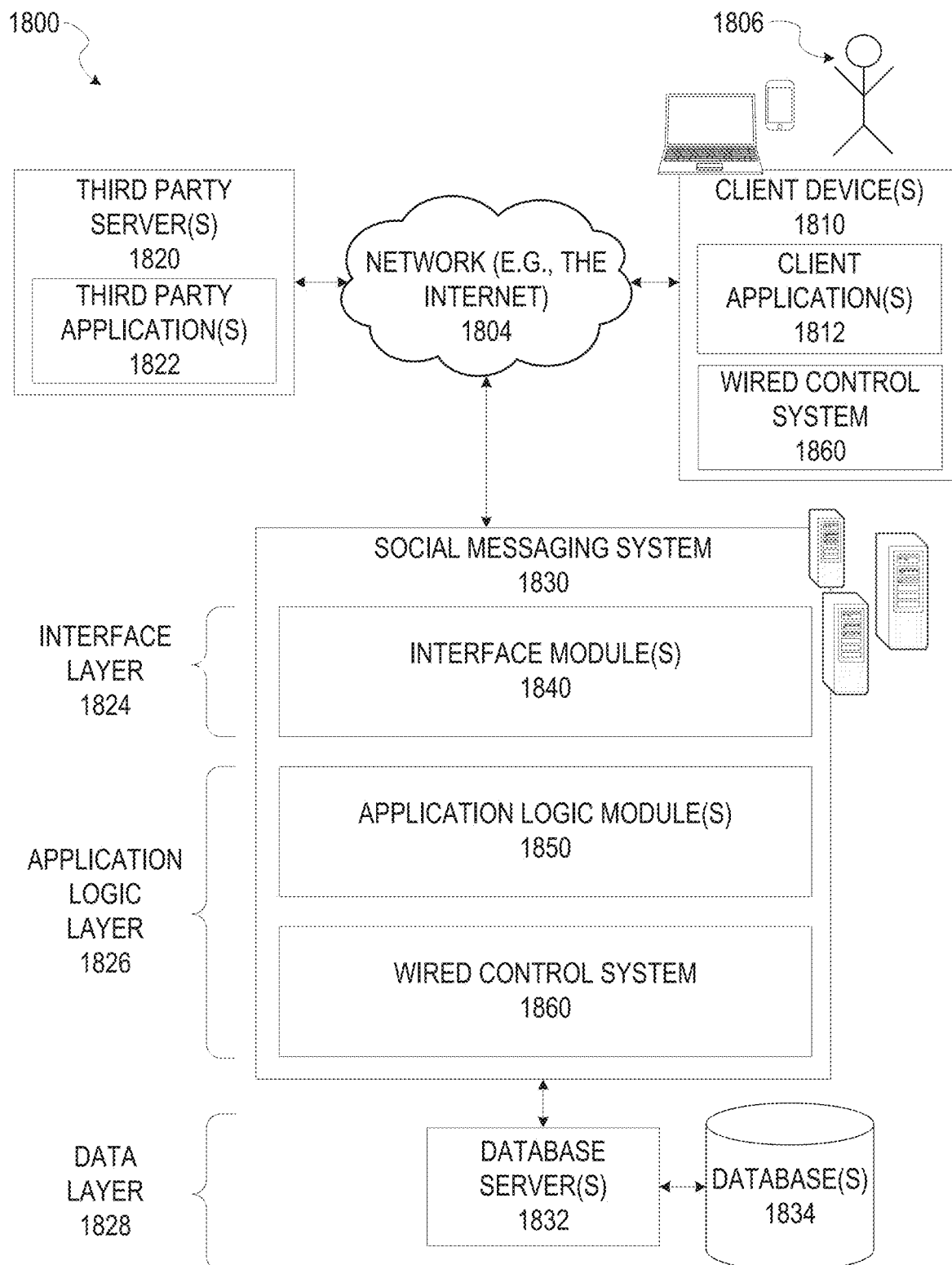
FIG. 18 is a schematic of a system that may be used with wearable devices, in accordance with some embodiments described herein.

FIG. 18 is a network diagram depicting a network system 1800 having a client-server architecture configured for exchanging data over a network, which may be used with wearable devices according to some embodiments. For example, the network system 1800 may be a messaging system where clients communicate and exchange data within the network system 1800, where certain data is communicated to and from wearable devices described herein. The data may pertain to various functions (e.g., sending and receiving video content as well as text and other media communication, etc.) and aspects associated with the network system 1800 and its users. Although the network system 1800 is illustrated herein as having a client-server architecture, other embodiments may include other network architectures, such as peer-to-peer or distributed network environments.

As shown in FIG. 18, the network system 1800 includes a social messaging system 1830. The social messaging system 1830 is generally based on a three-tiered architecture, consisting of an interface layer 1824, an application logic layer 1826, and a data layer 1828. As is understood by skilled artisans in the relevant computer and Internet-related arts, each module or engine shown in FIG. 18 represents a set of executable software instructions and the corresponding hardware (e.g., memory and processor) for executing the instructions. In various embodiments, additional functional modules and engines may be used with a social messaging system, such as that illustrated in FIG. 18, to facilitate additional functionality that is not specifically described herein. Furthermore, the various functional modules and engines depicted in FIG. 18 may reside on a single server computer, or may be distributed across several server computers in various arrangements. Moreover, although the social messaging system 1830 is depicted in FIG. 18 as having a three-tiered architecture, the inventive subject matter is by no means limited to such an architecture.

As shown in FIG. 18, the interface layer 1824 consists of interface modules (e.g., a web server) 1840, which receive requests from various client-computing devices and servers, such as client devices 1810 executing client applications 1812, and third-party servers 1820 executing third-party applications 1822. In response to received requests, the interface modules 1840 communicate appropriate responses to requesting devices via a network 1804. For example, the interface modules 1840 can receive requests such as Hypertext Transfer Protocol (HTTP) requests, or other web-based application programming interface (API) requests.

The client devices 1810 can execute conventional web browser applications or applications (also referred to as "apps") that have been developed for a specific platform to include any of a wide variety of mobile computing devices and mobile-specific operating systems (e.g., IOS™, ANDROID™, WINDOWS® PHONE). In an example, the client devices 1810 are executing the client applications 1812. The client applications 1812 can provide functionality to present information to a user 1806 and communicate via the network 1804 to exchange information with the social messaging system 1830. Each of the client devices 1810 can comprise a computing device that includes at least a display and communication capabilities with the network 1804 to access the social messaging system 1830. The client devices 1810 comprise, but are not limited to, remote devices, work stations, computers, general-purpose computers, Internet appliances, hand-held devices, wireless devices, portable devices, wearable computers, cellular or mobile phones, personal digital assistants (PDAs), smart phones, tablets, ultrabooks, netbooks, laptops, desktops, multi-processor systems, microprocessor-based or programmable consumer electronics, game consoles, set-top boxes, network PCs, mini-computers, and the like. The users 1806 can include a person, a machine, or other means of interacting with the client devices 1810. In some embodiments, the users 1806 interact with the social messaging system 1830 via the client devices 1810.

As shown in FIG. 18, the data layer 1828 has one or more database servers 1832 that facilitate access to information storage repositories or databases 1834. The databases 1834 are storage devices that store data such as member profile data, social graph data (e.g., relationships between members of the social messaging system 1830), and other user data.

An individual can register with the social messaging system 1830 to become a member of the social messaging system 1830. Once registered, a member can form social network relationships (e.g., friends, followers, or contacts) on the social messaging system 1830 and interact with a broad range of applications provided by the social messaging system 1830.

The application logic layer 1826 includes various application logic modules 1850, which, in conjunction with the interface modules 1840, generate various user interfaces with data retrieved from various data sources or data services in the data layer 1828. Individual application logic modules 1850 may be used to implement the functionality associated with various applications, services, and features of the social messaging system 1830. For instance, a social messaging application can be implemented with one or more of the application logic modules 1850. The social messaging application provides a messaging mechanism for users of the client devices 1810 to send and receive messages that include text and media content such as pictures and video. The client devices 1810 may access and view the messages from the social messaging application for a specified period of time (e.g., limited or unlimited). In an example, a particular message is accessible to a message recipient for a predefined duration (e.g., specified by a message sender) that begins when the particular message is first accessed. After the predefined duration elapses, the message is deleted and is no longer accessible to the message recipient. Of course, other applications and services may be separately embodied in their own application logic modules 1850.

As illustrated in FIG. 18, the social messaging system 1830 and/or the client applications 1810 include a wired control system 1860 that provides functionality to enable wired control of a device.

Figure 19:
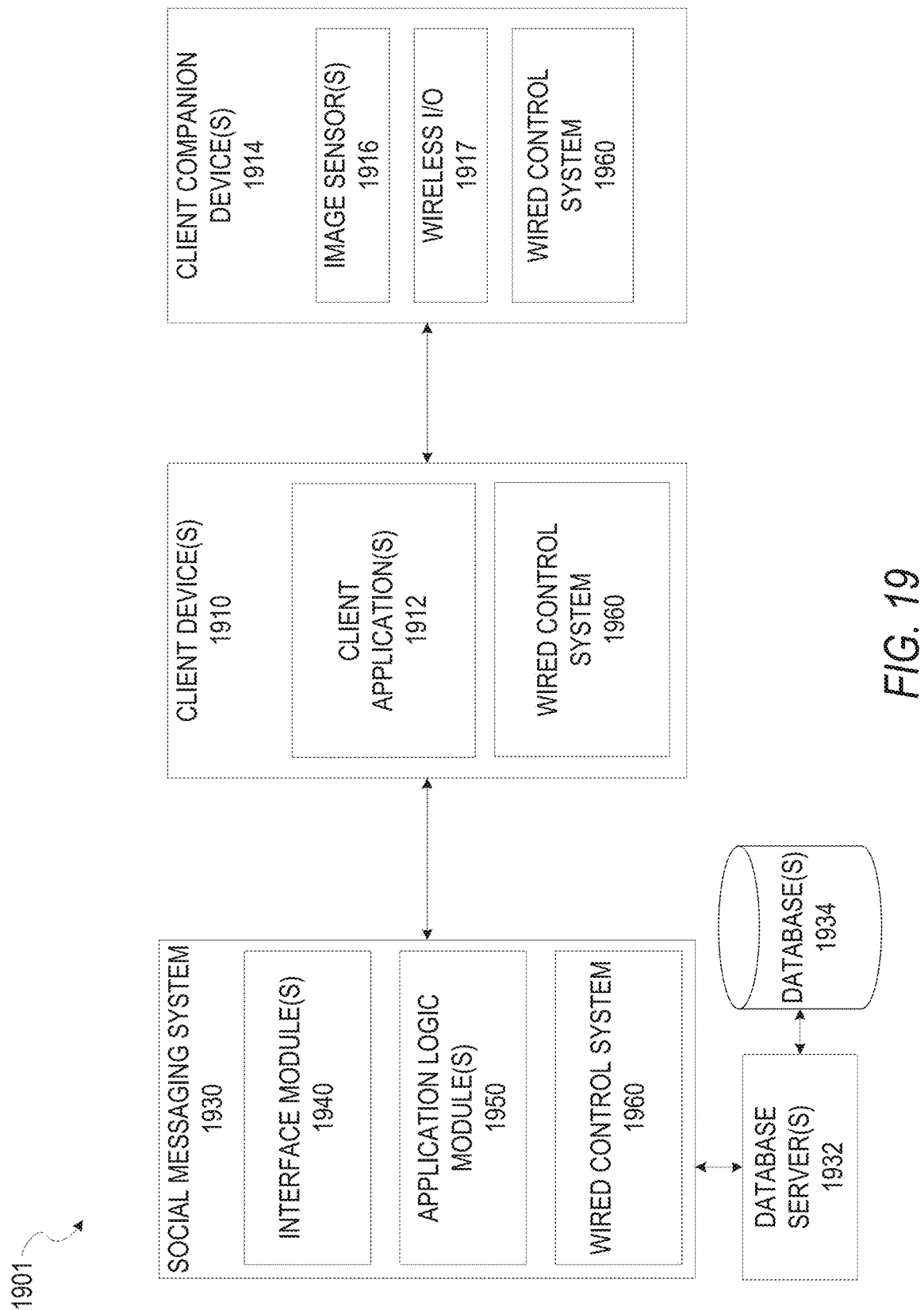
FIG. 19 is a schematic of a system that may be used with wearable devices, in accordance with some embodiments described herein.

FIG. 19 illustrates an alternative network system 1901 that may be used with certain embodiments. The network system 1901 includes a social messaging system 1930 with interface modules 1940, application logic modules 1950, database servers 1932, and databases 1934, as well as client devices 1910 operating client applications 1912, just as in the network system 1800. The network system 1901, however, additionally includes wearable client companion devices 1914 connected to the client devices 1910. In various embodiments, the wearable client companion device 1914 is configured for wired communication with either the client device 1910 or the social messaging system 1930. The client companion device 1914 may also be simultaneously configured for wireless communication with the client device 1910, the social messaging system 1930, or both. The client companion devices 1914 may be wearable devices such as glasses, visors, watches, or other network-enabled items. The client companion devices 1914 may also be any device described herein that accesses a network such as network via another device such as the client device 1910. The client companion devices 1914 include image sensors 1916, wireless input and output (I/O) 1917, and elements of a wired control system 1960 (e.g., for device testing, troubleshooting of wireless communication systems, or wired transmission of content. In some embodiments, only low-speed device test and control communications are enabled with the wired control system 1960). The client companion devices 1914 may include one or more processors, a display, a battery, and a memory, but may have limited processing and memory resources. In such embodiments, the client device 1910 and/or server computing devices used for the social messaging system 1930 may be used via network connections to provide remote processing and memory resources for the client companion devices 1914. In one embodiment, for example, the client companion device 1914 may be a pair of network-enabled glasses, such as the glasses of FIG. 2, and the client device 1910 may be a smartphone that enables access to the social messaging system 1930 to enable communication of video content captured with the image sensor(s) 1916.

FIG. 17 is a schematic diagram illustrating some of the components of the example electronic device in the form of the glasses 31. Note that a corresponding arrangement of interacting machine components can apply to embodiments in which an electronic device consistent with the disclosure comprises, for example, a mobile electronic device such as a wearable device (e.g., the glasses 31), a smartphone, a tablet, or a digital camera. The computer 61 of the glasses 31 includes a central processor 221 in communication with an onboard memory 226. The central processor 221 may be a central processing unit and/or a graphics processing unit. The memory 226 in this example embodiment comprises a combination of flash memory and random-access memory.

The glasses 31 further include a camera controller 214 in communication with the central processor 221 and the camera 69. The camera controller 214 comprises circuitry configured to control recording of either photographic content or video content based upon processing of control signals received from the single-action input mechanism (indicated generally by a single-action input mechanism 235 in FIG. 17) that includes the camera control button, and to provide for automatic adjustment of one or more image-capture parameters pertaining to capturing of image data by the camera 69 and on-board processing of the image data prior to persistent storage thereof and/or to presentation thereof to the user for viewing or previewing.

In some embodiments, the camera controller 214 comprises permanently configured circuitry, such as firmware or an application-specific integrated circuit (ASIC) configured to perform the various functions described herein. In other embodiments, the camera controller 214 may comprise a dynamically reconfigurable processor executing instructions that temporarily configure the processor to execute the various functions described herein.

The camera controller 214 interacts with the memory 226 to store, organize, and present image content in the form of photo content and video content. To this end, the memory 226 in this example embodiment comprises a photo content memory 228 and a video content memory 242. The camera controller 214 is thus, in cooperation with the central processor 221, configured to receive from the camera 69 image data representative of digital images captured by the camera 69 in accordance with some of the image-capture parameters, to process the image data in accordance with some of the image-capture parameters, and to store the processed image data in an appropriate one of the photo content memory 228 and the video content memory 242.

The camera controller 214 is further configured to cooperate with a display controller 249 to cause display on a display mechanism incorporated in the glasses 31 of selected photos and videos in the memory 226, and thus to provide previews of captured photos and videos. In some embodiments, the camera controller 214 will manage processing of images captured using automatic bracketing parameters for inclusion in a video file.

The single-action input mechanism 235 is communicatively coupled to the central processor 221 and the camera controller 214 to communicate signals representative of a current state of the camera control button, and thereby to communicate to the camera controller 214 whether or not the camera control button is currently being pressed. The camera controller 214 further communicates with the central processor 221 regarding the input signals received from the single-action input mechanism 235. In one embodiment, the camera controller 214 is configured to process input signals received via the single-action input mechanism 235 to determine whether a particular user engagement with the camera control button is to result in a recording of video content or photographic content, and/or to dynamically adjust one or more image-capture parameters based on processing of the input signals. For example, pressing of the camera control button for longer than a predefined threshold duration causes the camera controller 214 automatically to apply relatively less rigorous video processing to captured video content prior to persistent storage and display thereof. Conversely, pressing of the camera control button for shorter than the threshold duration in such an embodiment causes the camera controller 214 automatically to apply relatively more rigorous photo stabilization processing to image data representative of one or more still images.

The glasses 31 may further include various components common to mobile electronic devices such as smart glasses or smart phones, for example including a display controller for controlling display of visual media (including photographic and video content captured by the camera 69) on a display mechanism incorporated in the device. Note that the schematic diagram of FIG. 17 is not an exhaustive representation of all components forming part of the glasses 31.

Example Machine and Hardware Components

The example electronic devices described above may incorporate various computer components or machine elements, at least some of which are configured for performing automated operations and/or for automatically providing various functionalities. These include, for example, automated image data processing and image-capture parameter adjustment, as described. The glasses 31 may thus provide an independent computer system. Instead, or in addition, the glasses 31 may form part of a distributed system including one or more off-board processors and/or devices.

Figure 20:
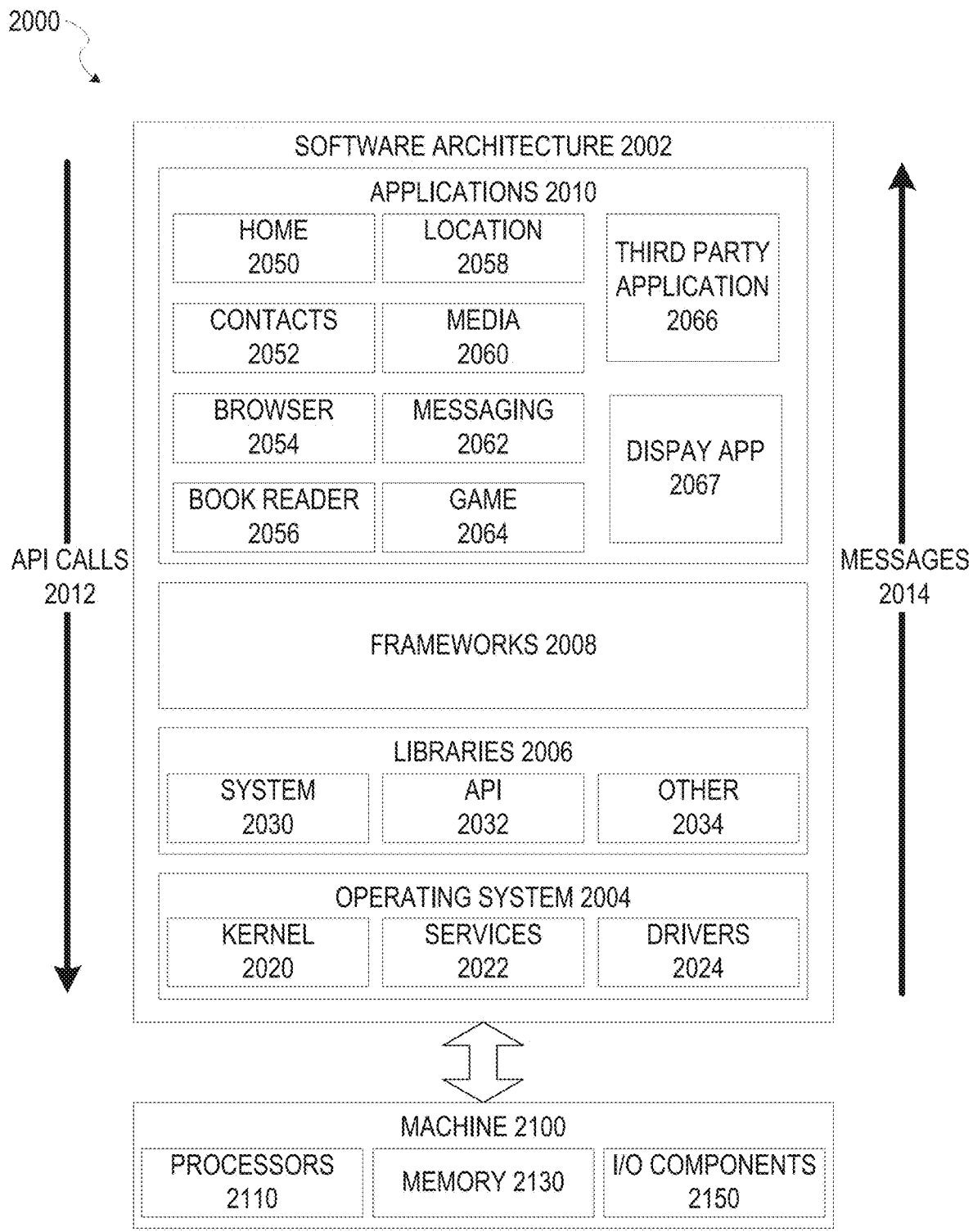
FIG. 20 is a block diagram illustrating an example of a software architecture that may be installed on a machine, according to some example embodiments.

FIG. 20 is a block diagram 2000 illustrating an architecture of software 2002, which can be installed on any one or more of the devices described above. FIG. 20 is merely a non-limiting example of a software architecture, and it will be appreciated that many other architectures can be implemented to facilitate the functionality described herein, in various embodiments, the software 2002 is implemented by hardware such as a machine 2100 of FIG. 21 that includes processors 2110, memory 2130, and I/O components 2150. In this example architecture, the software 2002 can be conceptualized as a stack of layers where each layer may provide a particular functionality. For example, the software 2002 includes layers such as an operating system 2004, libraries 2006, frameworks 2008, and applications 2010. Operationally, the applications 2010 invoke application programming interface (API) calls 2012 through the software stack and receive messages 2014 in response to the API calls 2012, consistent with some embodiments. In various embodiments, any client device, server computer of a server system, or other device described herein may operate using elements of the software 2002. Devices such as the camera controller 214 and other components of the portable electronic devices, as described earlier, may additionally be implemented using aspects of the software 2002.

In various implementations, the operating system 2004 manages hardware resources and provides common services. The operating system 2004 includes, for example, a kernel 2020, services 2022, and drivers 2024. The kernel 2020 acts as an abstraction layer between the hardware and the other software layers consistent with some embodiments. For example, the kernel 2020 provides memory management, processor management (e.g., scheduling), component management, networking, and security settings, among other functionality. The services 2022 can provide other common services for the other software layers. The drivers 2024 are responsible for controlling or interfacing with the underlying hardware, according to some embodiments. For instance, the drivers 2024 can include display drivers, camera drivers, BLUETOOTH® or BLUETOOTH® Low Energy drivers, flash memory drivers, serial communication drivers (e.g., USB drivers), WI-FI® drivers, audio drivers, power management drivers, and so forth. In certain implementations of a device such as the camera controller 214 of the glasses 31, low-power circuitry may operate using drivers 2024 that only contain BLUETOOTH® Low Energy drivers and basic logic for managing communications and controlling other devices, with other drivers operating with high-speed circuitry.

In some embodiments, the libraries 2006 provide a low-level common infrastructure utilized by the applications 2010. The libraries 2006 can include system libraries 2030 (e.g., C standard library) that can provide functions such as memory allocation functions, string manipulation functions, mathematic functions, and the like. In addition, the libraries 2006 can include API libraries 2032 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 2006 can also include a wide variety of other libraries 2034 to provide many other APIs to the applications 2010.

The frameworks 2008 provide a high-level common infrastructure that can be utilized by the applications 2010, according to some embodiments. For example, the frameworks 2008 provide various graphic user interface (GUI) functions, high-level resource management, high-level location services, and so forth. The frameworks 2008 can provide a broad spectrum of other APIs that can be utilized by the applications 2010, some of which may be specific to a particular operating system or platform.

In an example embodiment, the applications 2010 include a home application 2050, a contacts application 2052, a browser application 2054, a book reader application 2056, a location application 2058, a media application 2060, a messaging application 2062, a game application 2064, and a broad assortment of other applications such as a third-party application 2066. According to some embodiments, the applications 2010 are programs that execute functions defined in the programs. Various programming languages can be employed to create one or more of the applications 2010, structured in a variety of manners, such as object-oriented programming languages (e.g., Objective-C, Java, or C++) or procedural programming languages (e.g., C or assembly language). In a specific example, the third-party application 2066 (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or other mobile operating systems. In this example, the third-party application 2066 can invoke the API calls 2012 provided by the operating system 2004 to facilitate functionality described herein.

Embodiments described herein may particularly interact with a display application 2067. Such a display application 2067 may interact with the I/O components 2150 to establish various wireless connections with the described devices. The display application 2067 may, for example, communicate with the camera controller 214 to automatically control display of visual media captured by the glasses 31.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an ASIC. A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine, but deployed across a number of machines. In some example embodiments, the processors or processor-implemented modules are located in a single geographic location (e.g., within a home environment, an office environment, or a server farm). In other example embodiments, the processors or processor-implemented modules are distributed across a number of geographic locations.

Figure 21:
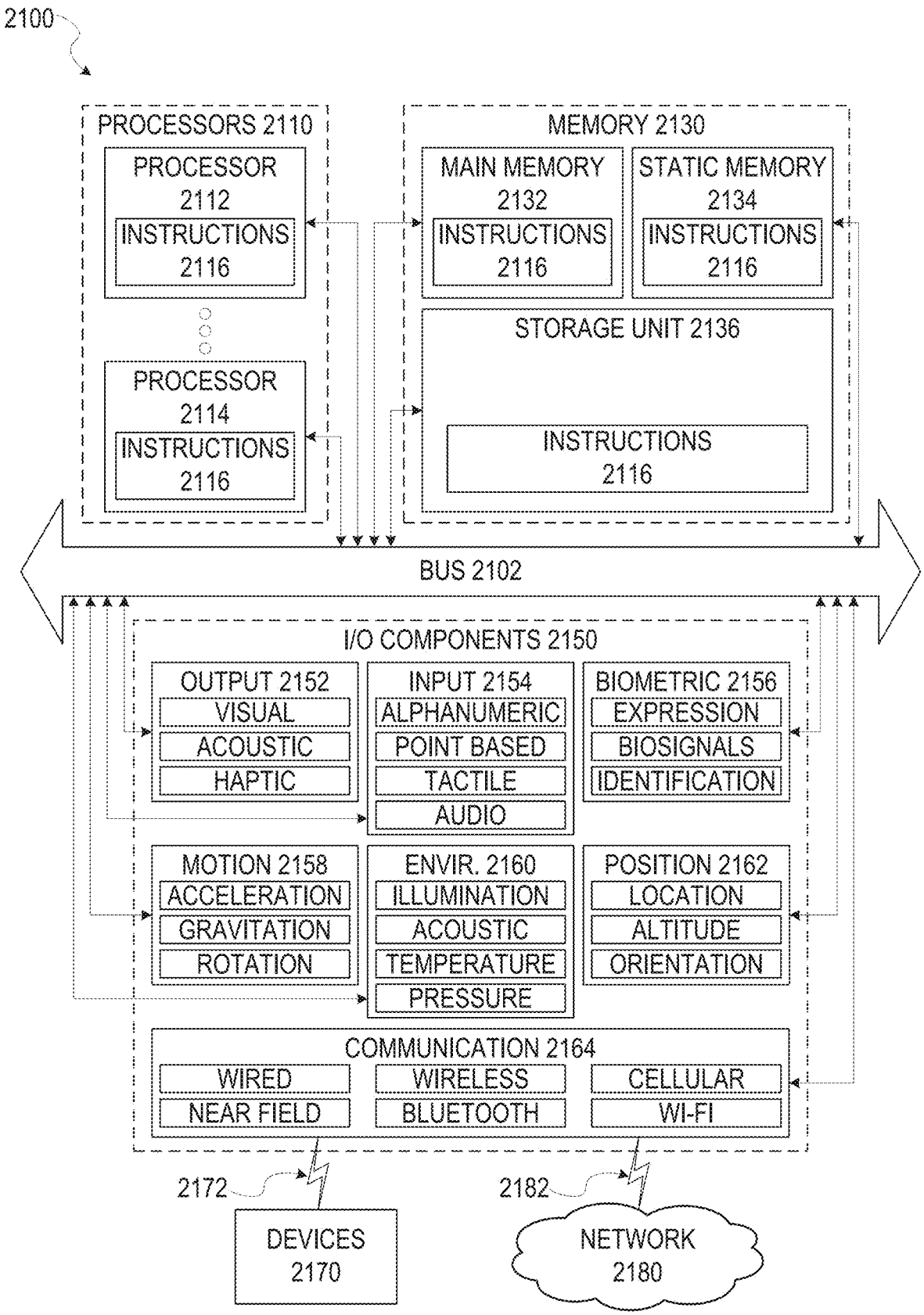
FIG. 21 illustrates a diagrammatic representation of a machine in the form of a computer system within which a set of instructions may be executed for causing the machine to perform any one or more of the methodologies discussed herein, according to some example embodiments.

FIG. 21 is a block diagram illustrating components of a machine 2100, according to some embodiments, able to read instructions from a machine-readable medium (e.g., a machine-readable storage medium) and perform any one or more of the methodologies discussed herein. Specifically, FIG. 21 shows a diagrammatic representation of the machine 2100 in the example form of a computer system, within which instructions 2116 (e.g., software, a program, an application, an applet, an app, or other executable code) for causing the machine 2100 to perform any one or more of the methodologies discussed herein can be executed. In alternative embodiments, the machine 2100 operates as a stand-alone device or can be coupled (e.g., networked) to other machines. In a networked deployment, the machine 2100 may operate in the capacity of a server machine or a client machine in a server-client network environment, or as a peer machine in a peer-to-peer (or distributed) network environment. The machine 2100 can comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 2116, sequentially or otherwise, that specify actions to be taken by the machine 2100. Further, while only a single machine 2100 is illustrated, the term "machine" shall also be taken to include a collection of machines 2100 that individually or jointly execute the instructions 2116 to perform any one or more of the methodologies discussed herein.

In various embodiments, the machine 2100 comprises processors 2110, memory 2130, and I/O components 2150, which can be configured to communicate with each other via a bus 2102. In an example embodiment, the processors 2110 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) include, for example, a processor 2112 and a processor 2114 that may execute the instructions 2116. The term "processor" is intended to include multi-core processors that may comprise two or more independent processors (also referred to as "cores") that can execute instructions contemporaneously. Although FIG. 21 shows multiple processors 2110, the machine 2100 may include a single processor with a single core, a single processor with multiple cores (e.g., a multi-core processor), multiple processors with a single core, multiple processors with multiple cores, or any combination thereof.

The memory 2130 comprises a main memory 2132, a static memory 2134, and a storage unit 2136 accessible to the processors 2110 via the bus 2102, according to some embodiments. The storage unit 2136 can include a machine-readable medium on which are stored the instructions 2116 embodying any one or more of the methodologies or functions described herein. The instructions 2116 can also reside, completely or at least partially, within the main memory 2132, within the static memory 2134, within at least one of the processors 2110 (e.g., within the processor's cache memory), or any suitable combination thereof, during execution thereof by the machine 2100. Accordingly, in various embodiments, the main memory 2132, the static memory 2134, and the processors 2110 are considered machine-readable media.

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium is shown in an example embodiment to be a single medium, the term "machine-readable medium" should be taken to include a single medium or multiple media (e.g., a centralized or distributed database, or associated caches and servers) able to store the instructions 2116. The term "machine-readable medium" shall also be taken to include any medium, or combination of multiple media, that is capable of storing instructions (e.g., the instructions 2116) for execution by a machine (e.g., the machine 2100), such that the instructions, when executed by one or more processors of the machine (e.g., the processors 2110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., Erasable Programmable Read-Only Memory (EPROM)), or any suitable combination thereof. The term "machine-readable medium" specifically excludes non-statutory signals per se.

The I/O components 2150 include a wide variety of components to receive input, provide output, produce output, transmit information, exchange information, capture measurements, and so on. In general, it will be appreciated that the I/O components 2150 can include many other components that are not shown in FIG. 21. The I/O components 2150 are grouped according to functionality merely for simplifying the following discussion, and the grouping is in no way limiting. In various example embodiments, the I/O components 2150 include output components 2152 and input components 2154. The output components 2152 include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor), other signal generators, and so forth. The input components 2154 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some further example embodiments, the I/O components 2150 include biometric components 2156, motion components 2158, environmental components 2160, or position components 2162, among a wide array of other components. For example, the biometric components 2156 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 2158 include acceleration sensor components (e.g., accelerometer), gravitation sensor components, rotation sensor components (e.g., gyroscope), and so forth. The environmental components 2160 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensor components (e.g., machine olfaction detection sensors, gas detection sensors to detect concentrations of hazardous gases for safety or to measure pollutants in the atmosphere), or other components that may provide indications, measurements, or signals corresponding to a surrounding physical environment. The position components 2162 include location sensor components (e.g., a Global Positioning System (GPS) receiver component), altitude sensor components (e.g., altimeters or barometers that detect air pressure from which altitude may be derived), orientation sensor components (e.g., magnetometers), and the like.

Communication can be implemented using a wide variety of technologies. The I/O components 2150 may include communication components 2164 operable to couple the machine 2100 to a network 2180 or devices 2170 via a coupling 2182 and a coupling 2172, respectively. For example, the communication components 2164 include a network interface component or another suitable device to interface with the network 2180. In further examples, the communication components 2164 include wired communication components, wireless communication components, cellular communication components, Near Field Communication (NFC) components, BLUETOOTH® components BLUETOOTH® Low Energy), WI-FI® components, and other communication components to provide communication via other modalities. The devices 2170 may be another machine or any of a wide variety of peripheral devices (e.g., a peripheral device coupled via a USB).

Moreover, in some embodiments, the communication components 2164 detect identifiers or include components operable to detect identifiers. For example, the communication components 2164 include Radio Frequency Identification (RFID) tag reader components, NFC smart tag detection components, optical reader components (e.g., an optical sensor to detect one-dimensional bar codes such as a Universal Product Code (UPC) bar code, multi-dimensional bar codes such as a Quick Response (QR) code, Aztec Code, Data Matrix, Dataglyph, MaxiCode, PDF417, Ultra Code, Uniform Commercial Code Reduced Space Symbology (UCC RSS)-2D bar codes, and other optical codes), acoustic detection components (e.g., microphones to identify tagged audio signals), or any suitable combination thereof. In addition, a variety of information can be derived via the communication components 2164, such as location via Internet Protocol (IP) geo-location, location via WI-FI® signal triangulation, location via detecting an BLUETOOTH® or NFC beacon signal that may indicate a particular location, and so forth.

In various example embodiments, one or more portions of the network 2180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a WI-FI® network, another type of network, or a combination of two or more such networks. For example, the network 2180 or a portion of the network 2180 may include a wireless or cellular network, and the coupling 2182 may be a Code Division Multiple Access (CDMA) connection, a Global System for Mobile communications (GSM) connection, or another type of cellular or wireless coupling. In this example, the coupling 2182 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks. Universal Mobile Telecommunications System (UMTS), High-Speed Packet Access (HSPA), Worldwide Interoperability for Microwave Access (WiMAX), Long-Term Evolution (LTE) standard, others defined by various standard-setting organizations, other long-range protocols, or other data-transfer technology.

In example embodiments, the instructions 2116 are transmitted or received over the network 2180 using a transmission medium via a network interface device (e.g., a network interface component included in the communication components 2164) and utilizing any one of a number of well-known transfer protocols (e.g., HTTP). Similarly, in other example embodiments, the instructions 2116 are transmitted or received using a transmission medium via the coupling 2172 (e.g., a peer-to-peer coupling) to the devices 2170. The term "transmission medium" shall be taken to include any intangible medium that is capable of storing, encoding, or carrying the instructions 2116 for execution by the machine 2100, and includes digital or analog communications signals or other intangible media to facilitate communication of such software.

Furthermore, the machine-readable medium is non-transitory (in other words, not having any transitory signals) in that it does not embody a propagating signal. However, labeling the machine-readable medium "non-transitory" should not be construed to mean that the medium is incapable of movement; the medium should be considered as being transportable from one physical location to another. Additionally, since the machine-readable medium is tangible, the medium may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A wearable device comprising:
   a charge interface comprising a first charge pad and a second charge pad; and
   circuitry coupled to the first charge pad and the second charge pad, wherein the circuitry is configured to:
   perform a charging process where the wearable device receives an electrical charge from a device to charge a battery via the first charge pad and the second charge pad;
   cause a transition signal to be sent via the first charge pad or the second charge pad to the device; and
   transmit data via the first charge pad or the second charge pad to the device.

2. The wearable device of claim 1 wherein the transmit data is during a first time period, and wherein the circuitry is further configured to:
   receive data via the first charge pad or the second charge pad from the device during a second time period, wherein the second time period is different from the first time period, and wherein the first time period and the second time period are after causing the transition signal to be sent.

3. The wearable device of claim 1 further comprising:
   a charge interface coupled to the first charge pad and the second charge pad, wherein the charge interface comprises a symmetrical interface configured to accept a coupling with a matching head of a charge cable.

4. The wearable device of claim 3, wherein the wearable device comprises a glasses front piece, the glasses front piece comprising a temple, and the temple comprising a hinge and the charge interface, wherein an arm coupled to the hinge is configured to cover the charge interface when the arm is in an open position and to uncover the charge interface when the arm is in a closed position.

5. The wearable device of claim 3 wherein the circuitry is further configured to:
   in response to a detection of a coupling of the charge interface with the matching head of the charge cable, perform the charging process.

6. The wearable device of claim 1 wherein the circuitry is further configured to:
   sense, during the charging process, for a charge disconnect interrupt detected via the first charge pad or the second charge pad.

7. The wearable device of claim 1 wherein the charging process is a first charging process, and wherein the circuitry is further configured to:
   perform a second charging process where the wearable device receives an electrical charge from the device to charge the battery via the first charge pad and the second charge pad.

8. The wearable device of claim 1 wherein the circuitry is further configured to:
  synchronize the wearable device with the device using the transition signal.

9. The wearable device of claim 1 wherein the circuitry is further configured to:
  perform the charging process until receiving an indication that the battery is charged.

10. The wearable device of claim 1 wherein the circuitry is further configured to:
  cause a capacitor to discharge after communication of the transition signal, the capacitor coupled between the first charge pad and the second charge pad.

11. The wearable device of claim 1 wherein the circuitry is further configured to:
  cause a capacitor to discharge before the cause the transition signal to be sent via the first charge pad or the second charge pad to the device.

12. The wearable device of claim 1 wherein the circuitry is configured to:
  perform the charging process for a fixed period of time.

13. The wearable device of claim 1 wherein the circuitry is configured to:
  perform the charging process until a charge disconnect interrupt signal is received.

14. The wearable device of claim 1 wherein the circuitry is configured to:
  cause the transition signal to be sent via the first charge pad and the second charge pad to the device.

15. The wearable device of claim 1 wherein the circuitry is configured to:
  transmit data via the first charge pad and the second charge pad to the device.

16. The wearable device of claim 1 wherein the transition signal is a first transition signal and wherein the data comprises a second transition signal indicating an end to the data.

17. A first device, the first device comprising:
  a first connecting pin and a second connecting pin; and
  circuitry configured to:
  perform a charging process where the first device receives an electrical charge from a second device to charge a battery via a first charge pad and a second charge pad;
  cause a transition signal to be sent via the first charge pad or the second charge pad to a second device; and
  transmit data via the first charge pad or the second charge pad to the second device.

18. The first device of claim 17 further comprising:
  a charge interface coupled to the first charge pad and the second charge pad, wherein the charge interface comprises a symmetrical interface configured to accept a coupling with a matching head of a charge cable.

19. A method performed on a wearable device, the method comprising:
  performing a charging process where the wearable device receives an electrical charge from a computing device to charge a battery via a first charge pad and a second charge pad;
  communicating a transition signal via the first charge pad or the second charge pad to the computing device; and
  following the transition signal, transmitting data via the first charge pad or the second charge pad during.

20. The method of claim 19, wherein the wearable device receives the electrical charge via a charge interface, and wherein the charge interface comprises a symmetrical interface configured to accept a coupling with a matching head of a charge cable.

* * * * *